United States Patent
Lu et al.

(10) Patent No.: US 10,276,248 B1
(45) Date of Patent: Apr. 30, 2019

(54) EARLY RAMP DOWN OF DUMMY WORD LINE VOLTAGE DURING READ TO SUPPRESS SELECT GATE TRANSISTOR DOWNSHIFT

(71) Applicant: SanDisk Technologies LLC, Plano, TX (US)

(72) Inventors: Ching-Huang Lu, Fremont, CA (US); Vinh Diep, San Jose, CA (US)

(73) Assignee: SanDisk Technologies LLC, Addison, TX (US)

(*) Notice: Subject to any disclaimer, the term of this patent is extended or adjusted under 35 U.S.C. 154(b) by 0 days.

(21) Appl. No.: 15/849,019

(22) Filed: Dec. 20, 2017

(51) Int. Cl.
G11C 11/34 (2006.01)
G11C 16/04 (2006.01)
G11C 16/28 (2006.01)
G11C 16/34 (2006.01)

(52) U.S. Cl.
CPC .......... G11C 16/28 (2013.01); G11C 16/0483 (2013.01); G11C 16/3454 (2013.01)

(58) Field of Classification Search
CPC .. G11C 16/28; G11C 16/0483; G11C 16/3454
See application file for complete search history.

(56) References Cited

U.S. PATENT DOCUMENTS

| 7,450,430 | B2 | 11/2008 | Hemink et al. |
| 9,343,159 | B2 | 5/2016 | Dong et al. |
| 9,412,463 | B1 | 8/2016 | Chen et al. |
| 9,620,233 | B1 | 4/2017 | Dong et al. |
| 9,715,937 | B1* | 7/2017 | Pang ............... G11C 16/26 |
| 9,761,320 | B1* | 9/2017 | Chen .............. G11C 16/0483 |
| 2006/0239077 | A1 | 10/2006 | Park et al. |
| 2009/0180317 | A1 | 7/2009 | Kang et al. |
| 2012/0081962 | A1 | 4/2012 | Tsai et al. |
| 2013/0314995 | A1 | 11/2013 | Dutta et al. |
| 2016/0021786 | A1 | 7/2016 | Chen et al. |

OTHER PUBLICATIONS

U.S. Appl. No. 15/621,215, filed Jun. 13, 2017 by Diep et al.
U.S. Appl. No. 15/621,222, filed Jun. 13, 2017 by Diep et al.
U.S. Appl. No. 15/693,982, filed Sep. 1, 2017 by Diep et al.
International Search Report & The Written Opinion of the International Searching Authority dated Jan. 15, 2019, International Application No. PCT/US2018/052379 filed Sep. 24, 2018.

* cited by examiner

Primary Examiner — Toan K Le
(74) Attorney, Agent, or Firm — Vierra Magen Marcus LLP

(57) ABSTRACT

Techniques for reducing a downshift in the threshold voltage of a select gate transistor of a memory device. Due to an electric field in a NAND string, holes can move in a charge-trapping layer from a dummy memory cell to a select gate transistor and combine with electrons in the transistor, reducing the threshold voltage. In one approach, the electric field is reduced at the end of a sensing operation by ramping down the voltage of the dummy memory cells before ramping down the voltage of the select gate transistors. The ramp down of the voltage of the selected memory cells can occur after ramping down the voltage of the dummy memory cells and before ramping down of the voltage of the select gate transistors. A further option involves elevating the voltage of the select gate transistors before it is ramped down.

20 Claims, 21 Drawing Sheets

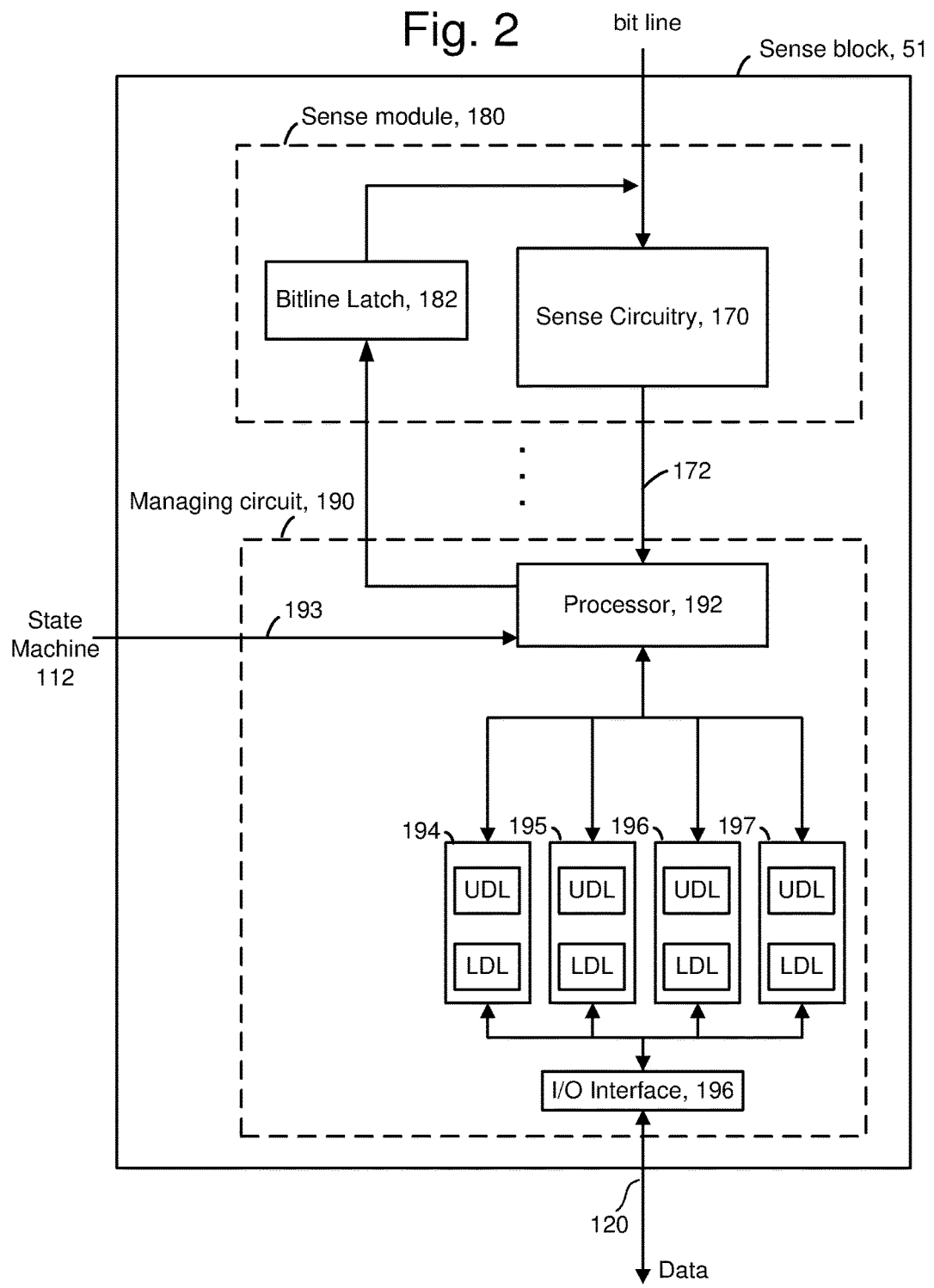

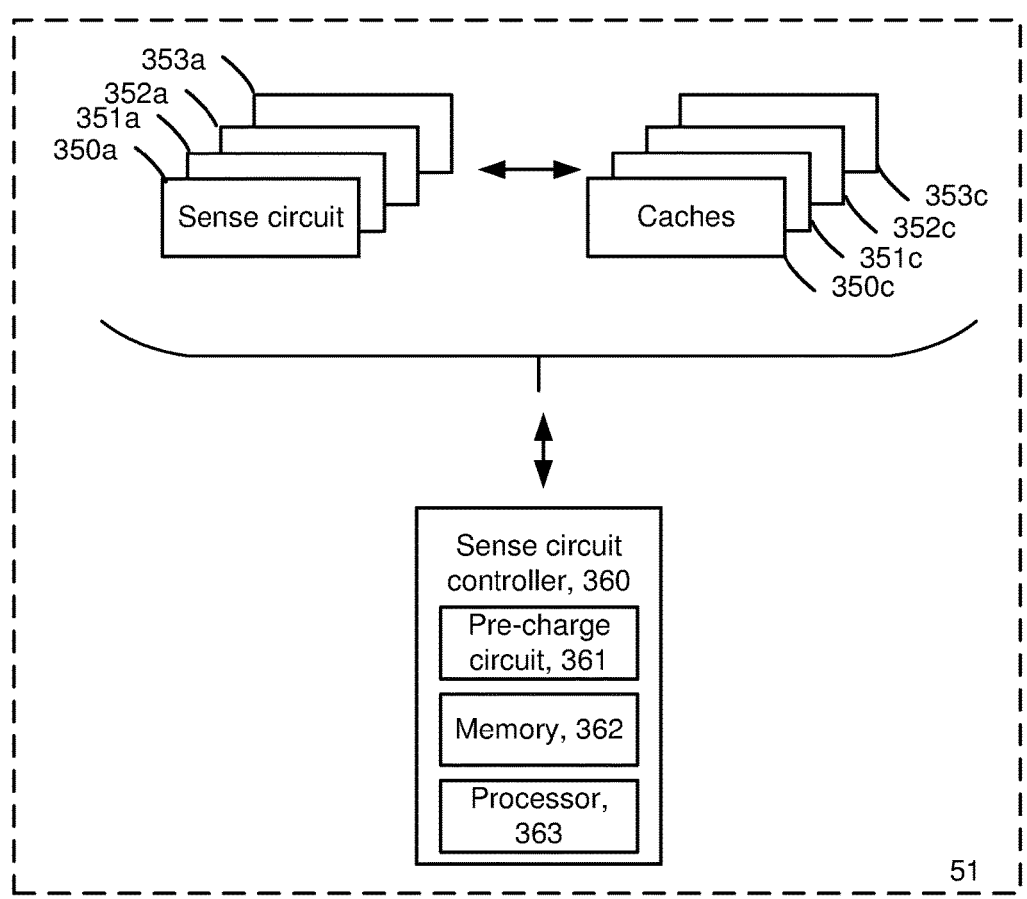

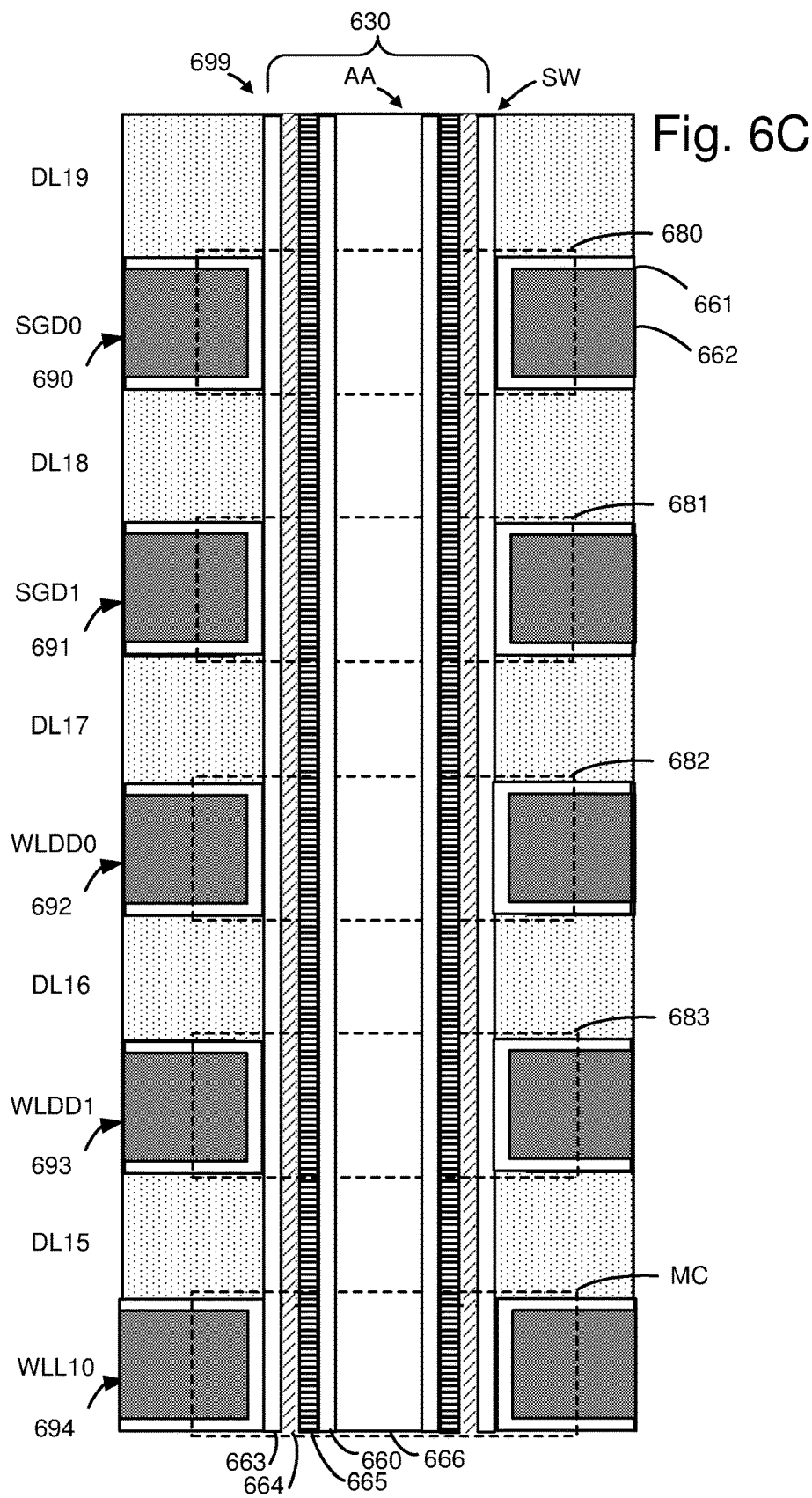

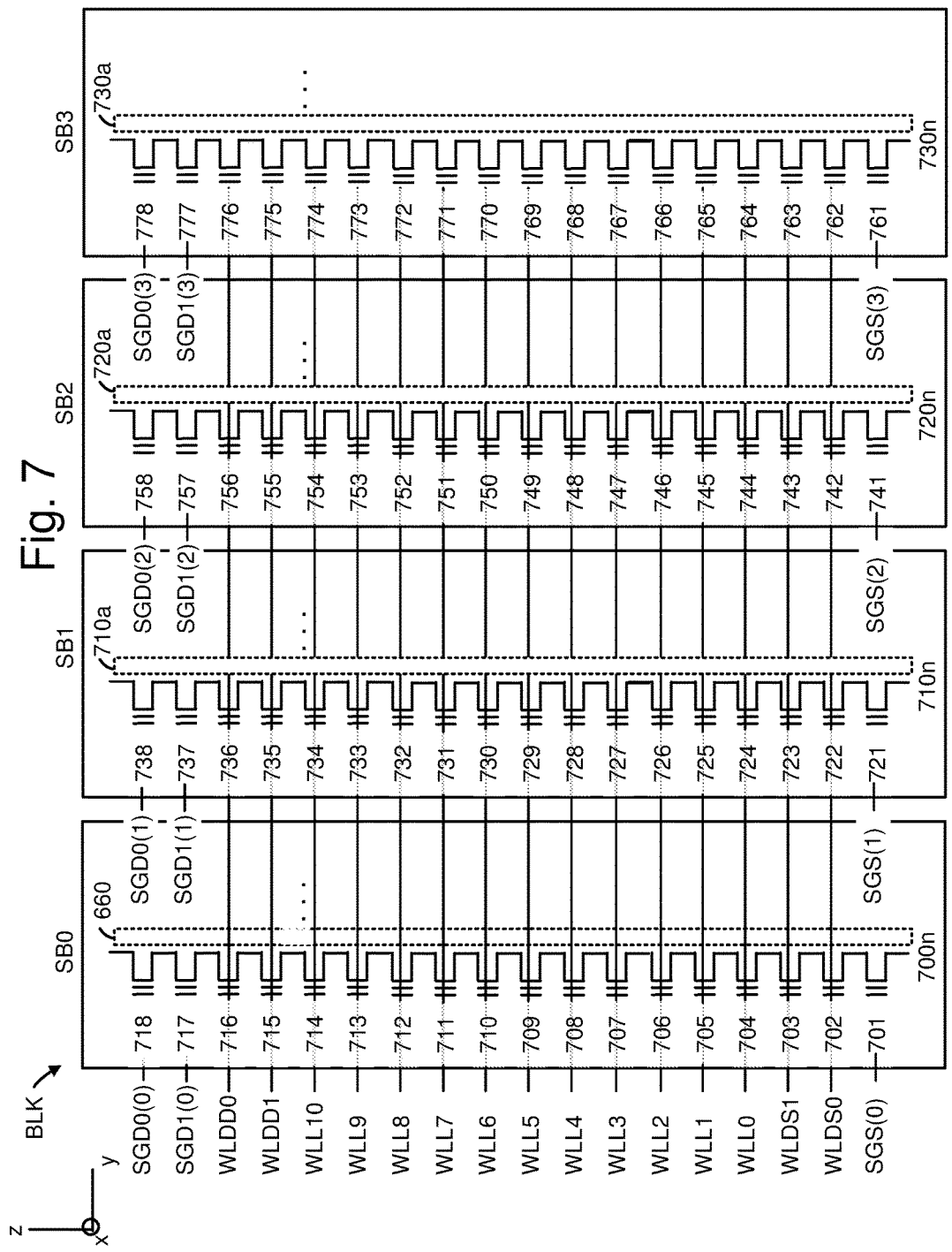

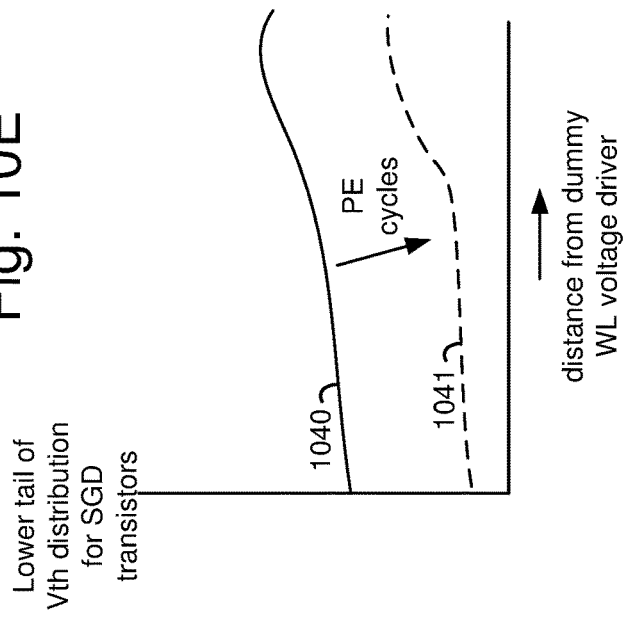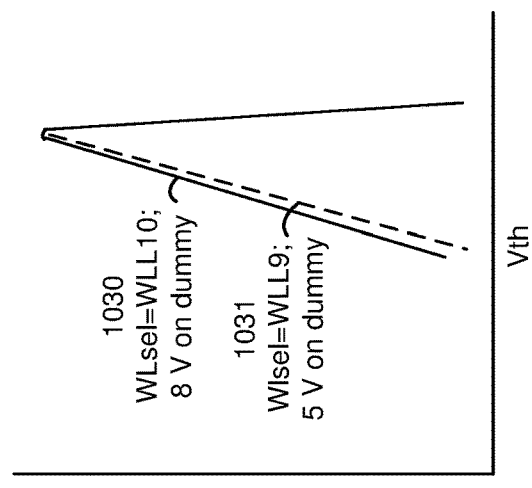

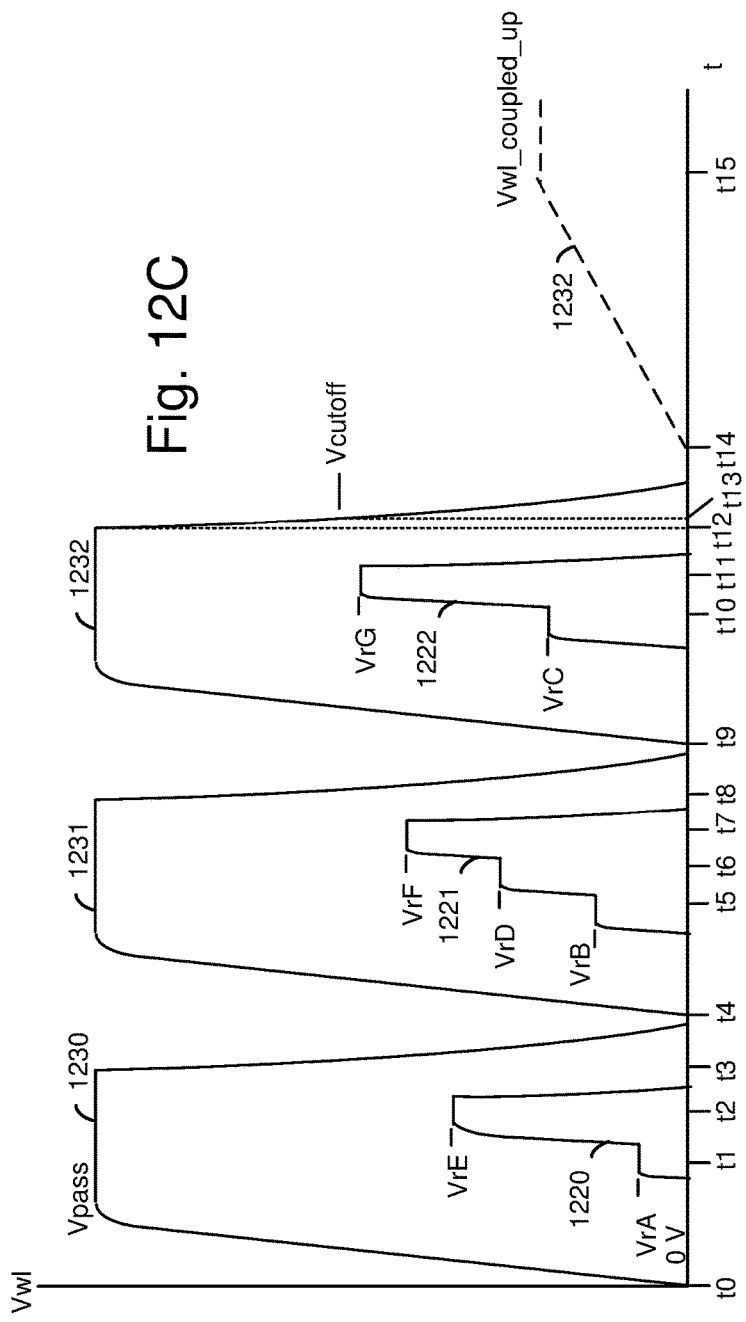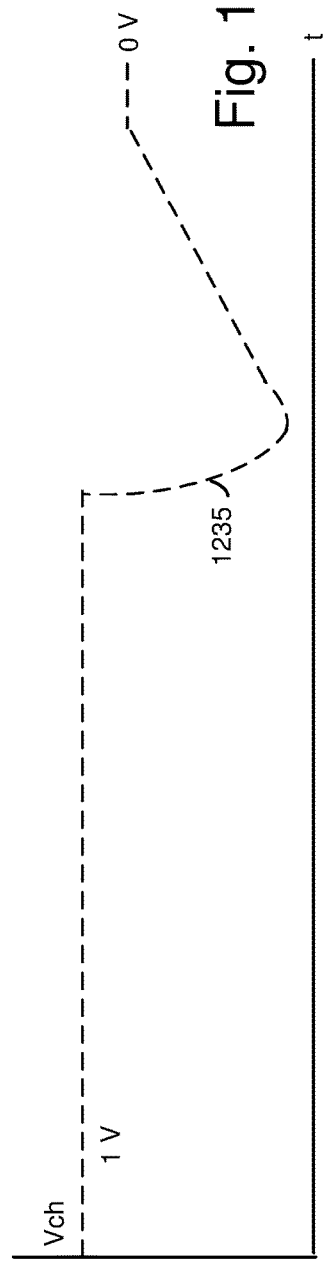

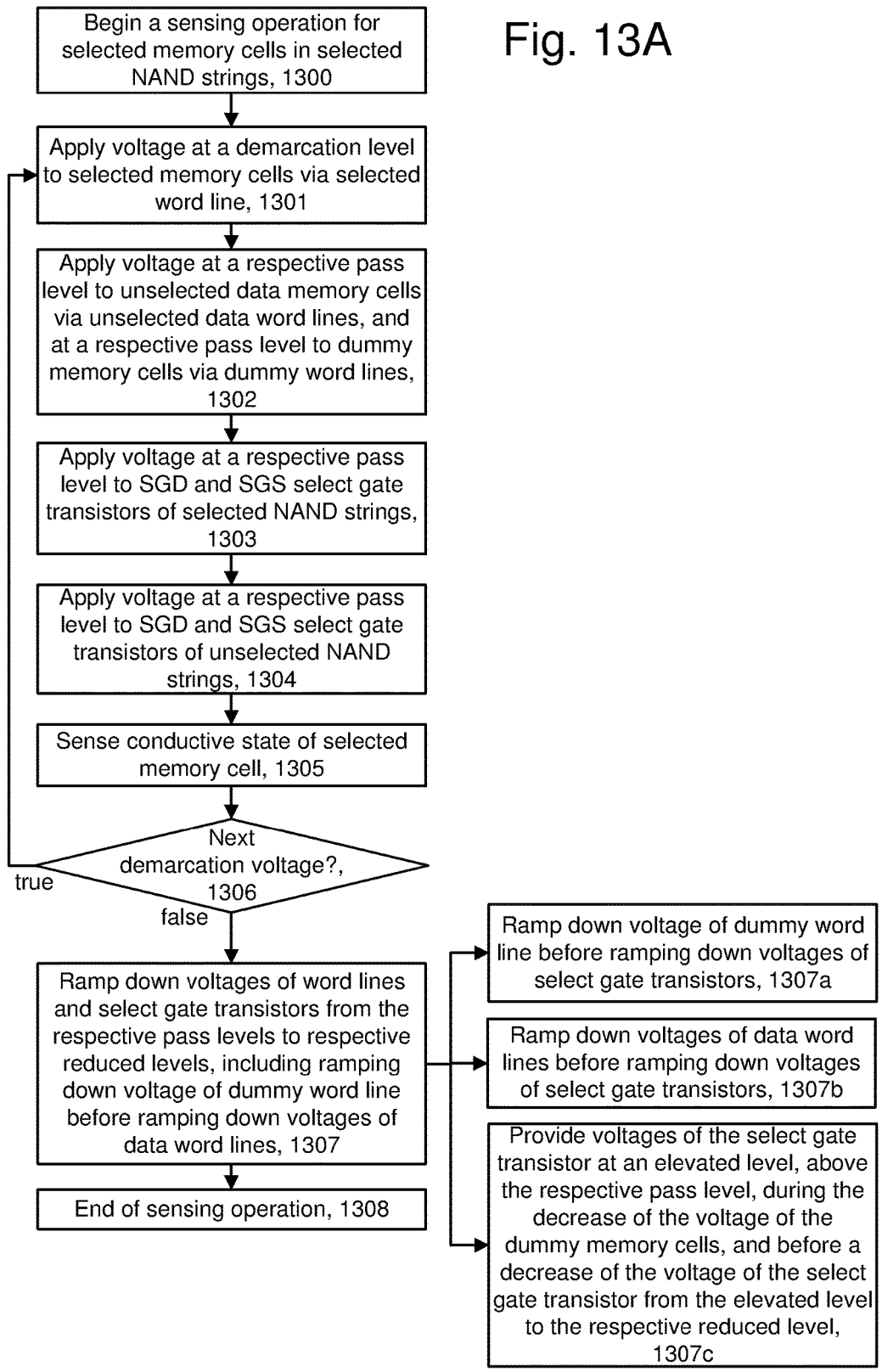

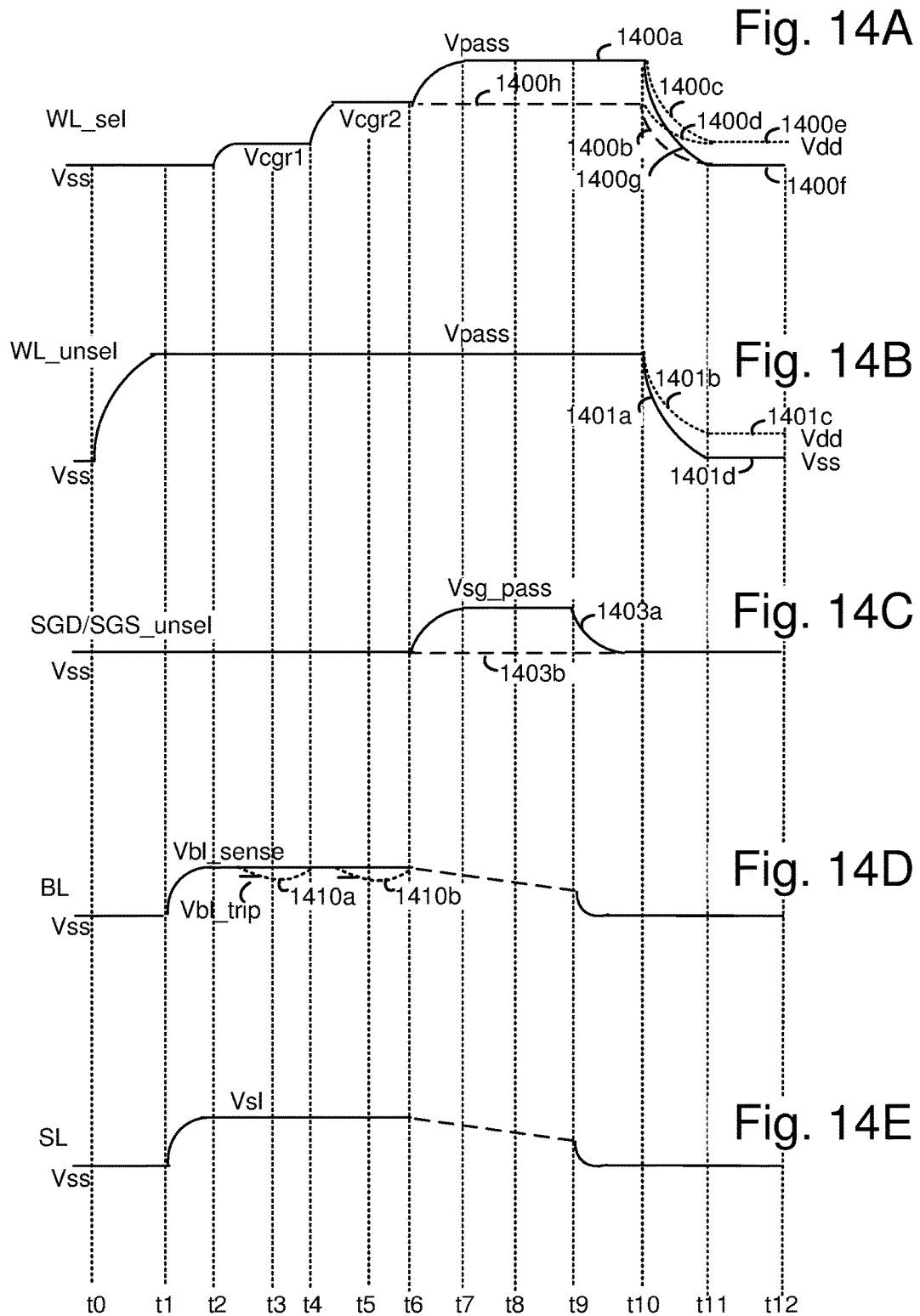

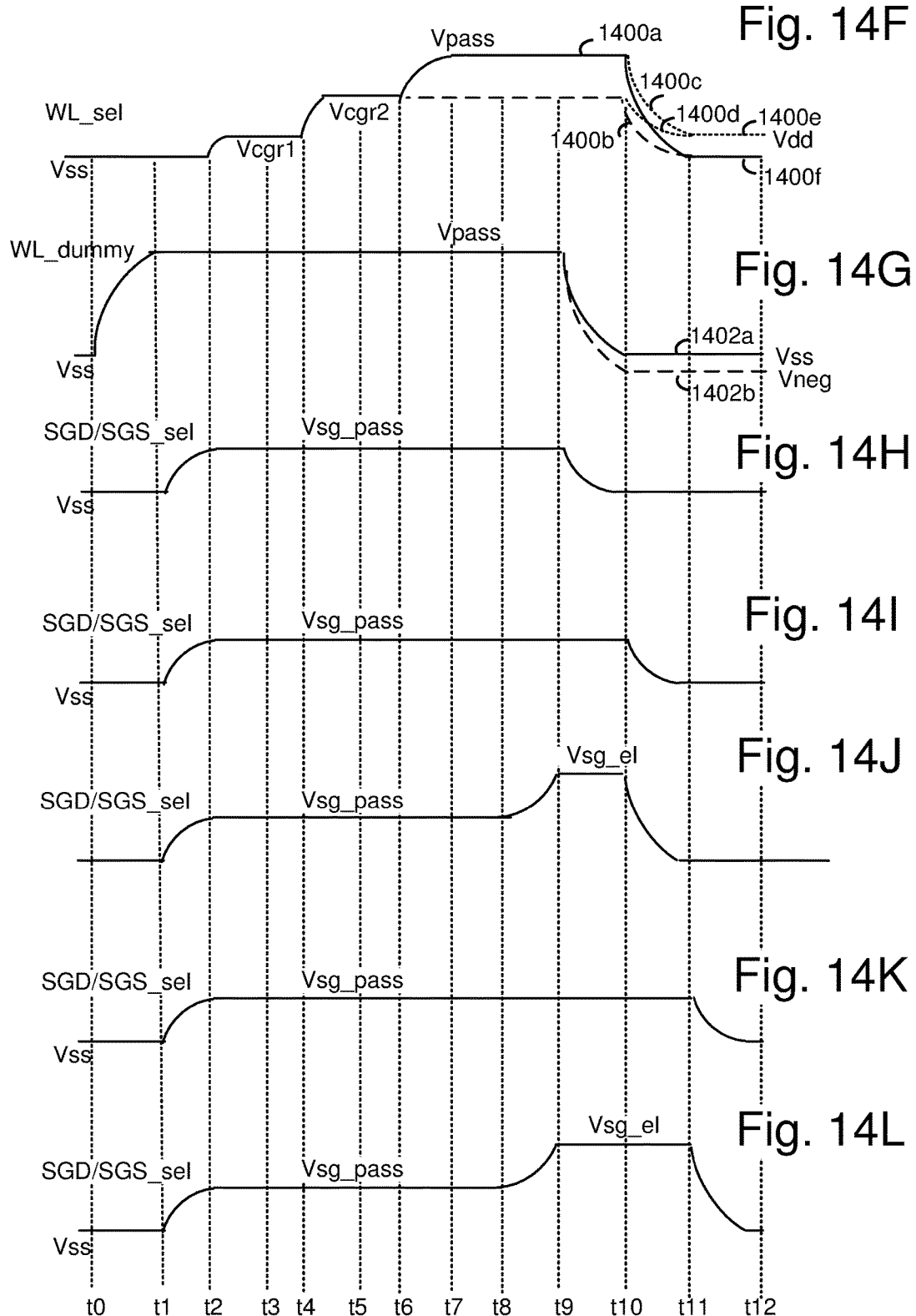

EARLY RAMP DOWN OF DUMMY WORD LINE VOLTAGE DURING READ TO SUPPRESS SELECT GATE TRANSISTOR DOWNSHIFT

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in NAND strings, for instance, where select gate transistors are provided at the ends of the NAND string to selectively connect a channel of the NAND string to a source line or bit line. However, various challenges are presented in operating such memory devices.

BRIEF DESCRIPTION OF THE DRAWINGS

FIG. 2 is a block diagram depicting one embodiment of the sense block 51 of FIG. 1.

FIG. 3 depicts another example block diagram of the sense block 51 of FIG. 1.

FIG. 6C depicts a close-up view of the region 622 of the stack of FIG. 6A.

FIG. 7 depicts an example view of NAND strings in sub-blocks in a 3D configuration which is consistent with FIG. 6A.

FIG. 10C depicts a plot of a number of SGD transistors versus Vth, where an allowed ramp down time for a dummy word line voltage is relatively short after a sensing operation, when two different word lines are subject to the sensing operation in repeated erase, program and read cycles.

FIG. 10D depicts a plot of a number of SGD transistors versus Vth, where an allowed ramp down time for a dummy word line voltage is relatively long after a sensing operation, when two different word lines are subject to the sensing operation in repeated erase, program and read cycles.

FIG. 10E depicts a lower tail of a Vth distribution for SGD transistors as a function of a number of program-erase cycles and a distance of a NAND string from a dummy word line voltage driver.

FIG. 11 depicts a plot of the NAND string 700n of FIG. 7, showing the movement of holes toward the select gate transistors.

FIG. 12C depicts a plot of example waveforms in a read operation, showing coupling up of a word line voltage.

FIG. 12D depicts a plot of a channel voltage (Vch) corresponding to FIG. 12C.

FIG. 13A depicts a flowchart of an example sensing process.

FIG. 14A depicts an example voltage signal for a selected word line in a sensing process.

FIG. 14B depicts an example voltage signal for unselected word lines in a sensing process.

FIG. 14C depicts an example voltage signal for unselected select gate transistors in a sensing process.

FIG. 14D depicts an example voltage signal for a bit line of a selected NAND string in a sensing process.

FIG. 14E depicts an example voltage signal for a source line in a sensing process.

FIG. 14F repeats the example voltage signal 1400a of FIG. 14A for a selected word line in a sensing process, for reference in connection with FIG. 14G to 14L.

FIG. 14G depicts an example voltage signal for a dummy word line in a sensing process, where a ramp down of the voltage signal from a respective pass voltage at t9 occurs before a ramp down of the voltage signal of the selected word line at t10.

FIG. 14H depicts an example voltage signal for a select gate transistor of a selected NAND string, where a ramp down of the voltage signal from a respective pass voltage occurs at t9.

FIG. 14I depicts an example voltage signal for a select gate transistor of a selected NAND string, where a ramp down of the voltage signal from a respective pass voltage occurs at t10.

FIG. 14J depicts an example voltage signal for a select gate transistor of a selected NAND string, where the voltage signal is increased from a respective pass voltage to an elevated level at t8, then ramped down from the elevated level at t10.

FIG. 14K depicts an example voltage signal for a select gate transistor of a selected NAND string, where a ramp down of the voltage signal from a respective pass voltage occurs at t11.

FIG. 14L depicts an example voltage signal for a select gate transistor of a selected NAND string, where the voltage signal is increased from a respective pass voltage to an elevated level at t8, then ramped down from the elevated level at t11.

DETAILED DESCRIPTION

Apparatuses and techniques are described for reducing a downshift in the threshold voltage of a select gate transistor of a memory device.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string which is connected to a source line. Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical memory strings in a stack, where the stack comprises alternating conductive and dielectric layers. The conductive layers act as word lines which are connected to the memory cells. Each memory string may have the shape of a pillar which intersects with the word lines to form the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

Figure 9:
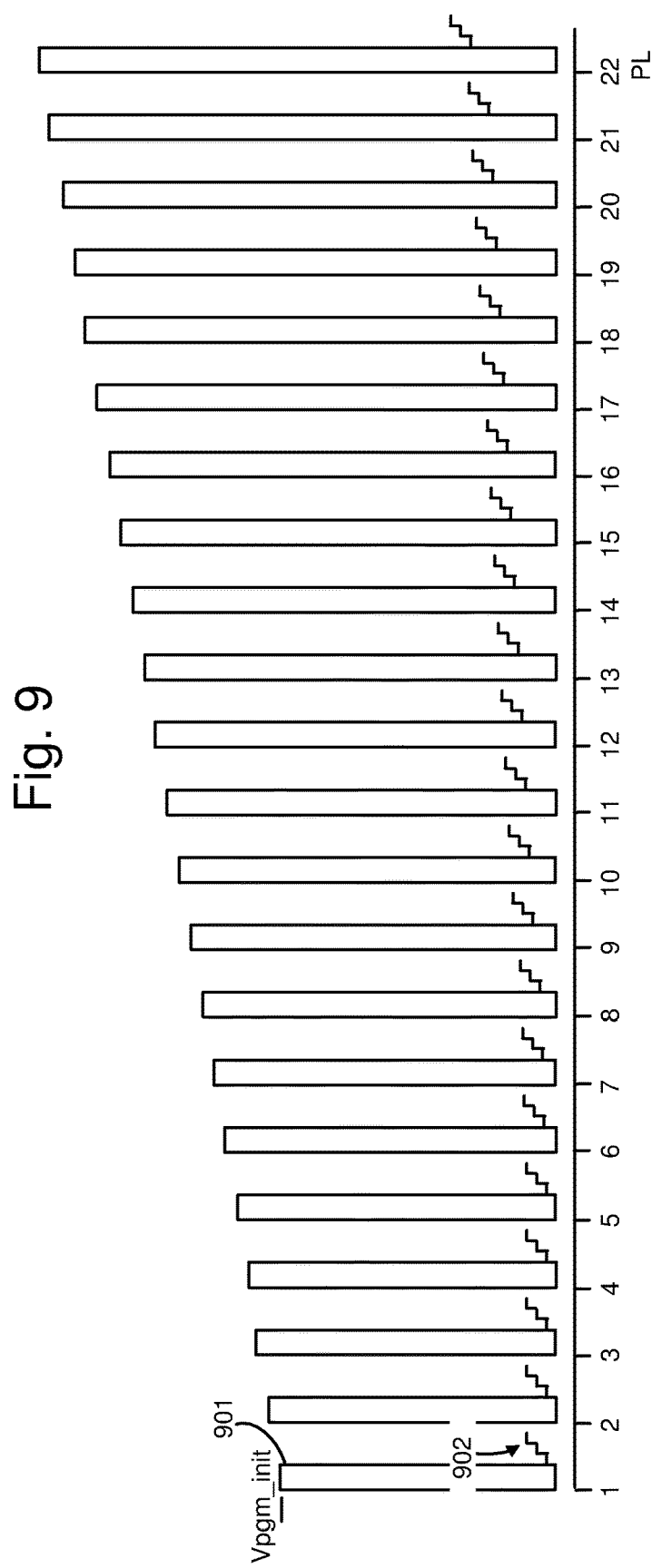
FIG. 9 depicts a voltage signal used in a series of program loops in an example program operation.

During a program operation, the memory cells are programmed according to a word line programming order. For example, the programming may start at the word line at the source-side of the block and proceed to the word line at the drain-side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a series of program loops or program-verify iterations, such as depicted in FIG. 9. Each program loop includes a program voltage followed by one or more verify voltages. The verify voltages are used in verify tests which determine whether the memory cells have completed programming to an assigned data state. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with an assigned data state according to write data in a program command. Based on its assigned data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 10A). In a four-bit per cell memory device, there are sixteen data states including the erased state and fifteen higher data states. The data states may be referred to as the S0-S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage (Vth) levels of adjacent data states. During the read operation, the voltages of the unselected word lines are ramped up to a read pass level which is high enough to place the unselected memory cells in a strongly conductive state, to avoid interfering with the sensing of the selected memory cells.

To ensure proper program, erase and read operations in a NAND string, the Vth of the SGD transistors should be in a specified range. However, it has been observed that the Vth can decrease over time. See FIG. 10B. Specifically, when a charge-trapping region extends in the NAND string between the SGD transistor and the dummy memory cell, holes can move from the dummy memory cell to the SGD transistor and combine with electrons in the SGD transistor, reducing the Vth. This movement occurs due to an electric field between the dummy memory cell and the SGD transistor. The electric field is higher when the voltage of the dummy word line does not fully ramp down. This can occur due to insufficient time allocated for the ramp down and the relatively high level of the dummy word line voltage. One possible solution is to allocate more time for the ramp down, but this results in an undesired time penalty. Another possible solution is to erase the dummy memory cell to a shallower depth so that its Vth is higher. However, this can alter the erase depths of the data memory cells due to a reduced current in the string during the erase-verify test. Another possible solution is to perform a separate program operation for the dummy memory cell after a block is erased. However, this requires additional time.

Techniques provided herein address the above and other issues. In one approach, the electric field between the dummy memory cell and a select gate transistor is reduced at the end of a sensing operation, when the voltages are ramped down from a respective pass level to a respective reduced level. This can be achieved by performing the ramp down of the voltage of the dummy memory cells before the ramp down of the voltage of the select gate transistors. This can be done while avoiding or minimizing any time penalty in the sensing operation. One option involves ramping down the voltage of the selected memory cells after ramping down the voltage of the dummy memory cells and before ramping down the voltage of the selected memory cells. A further option involves elevating the voltage of the select gate transistors before ramping them down. The techniques are applicable to both SGD and SGS transistors.

These and other features are discussed further below.

Figure 1A:
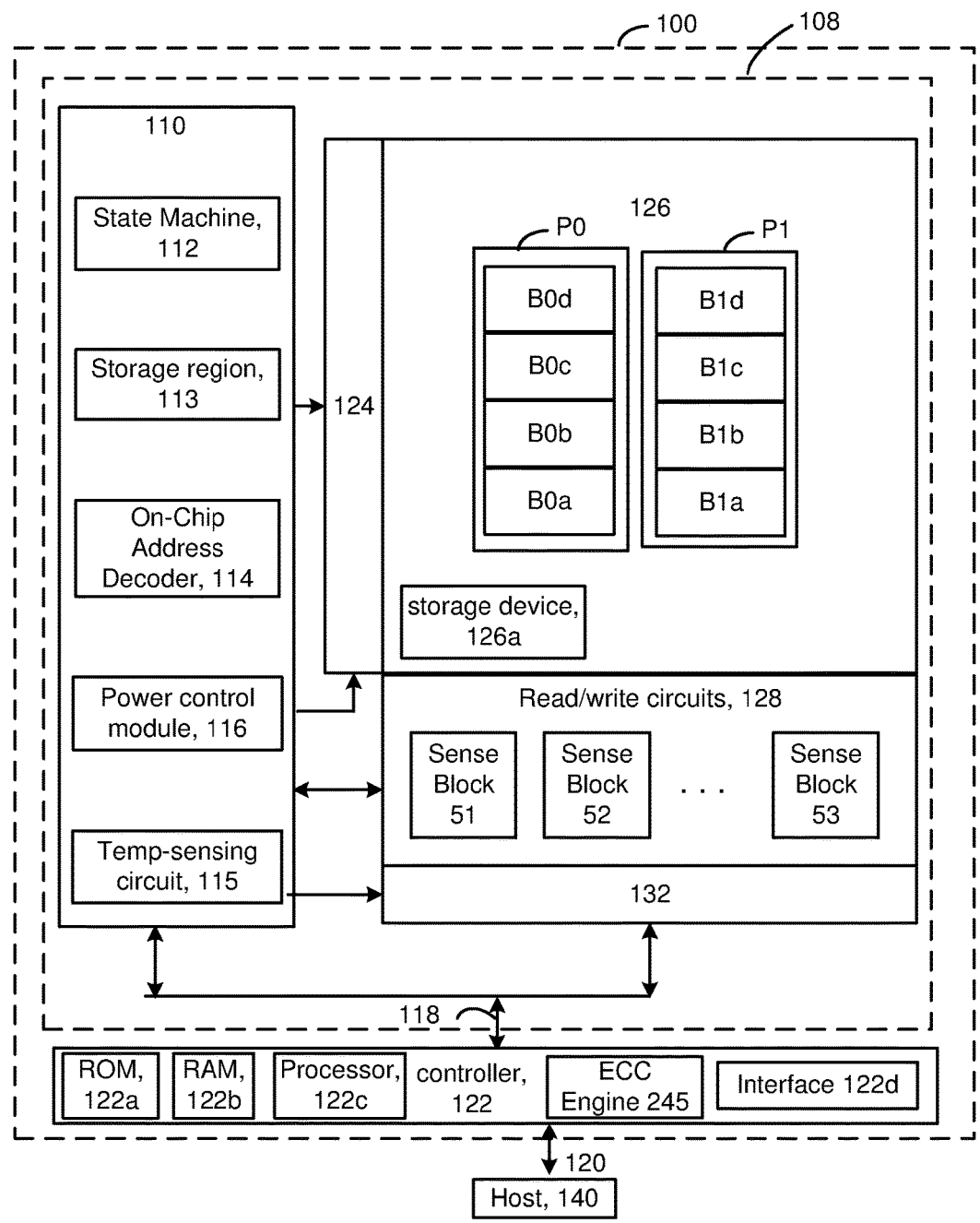
FIG. 1A is a block diagram of an example memory device comprising memory cells arranged in different planes.

FIG. 1A is a block diagram of an example memory device comprising memory cells arranged in different planes. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The memory structure 126 may comprise multiple planes, such as neighbor planes P0 and P1. Each plane may include one or more blocks of memory cells. For example, P0 includes blocks B0a-B0d and P1 includes blocks B1a-B1d.

The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Figure 1B:
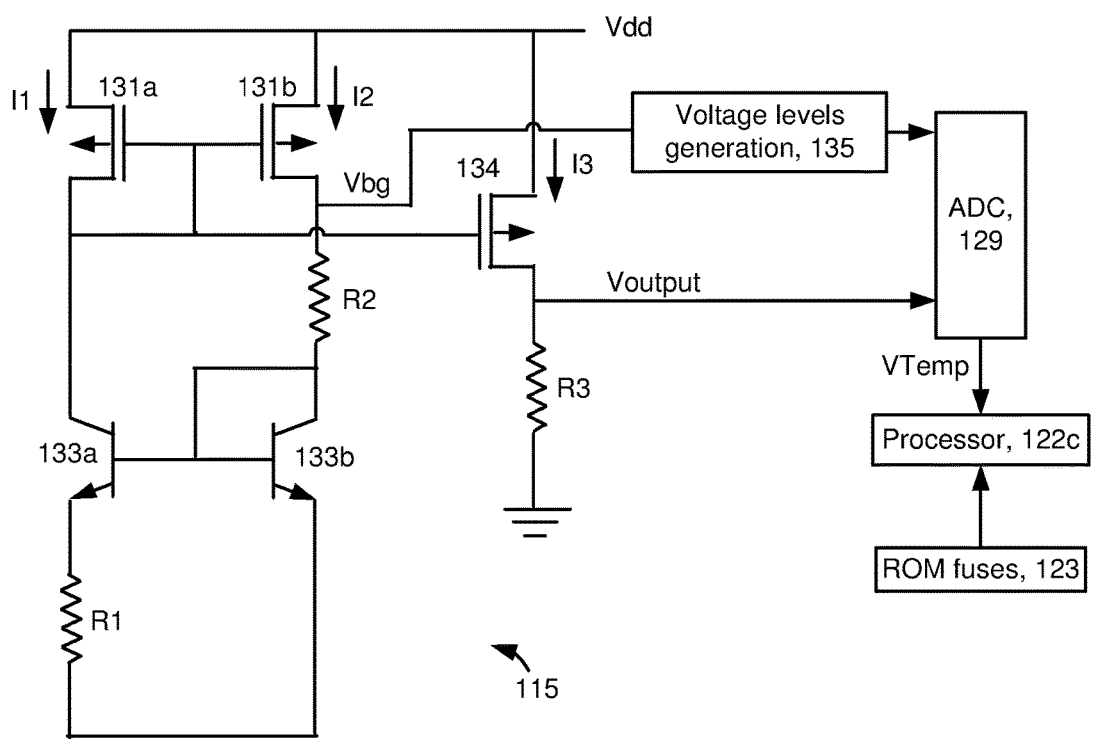
FIG. 1B depicts an example of the temperature-sensing circuit 115 of FIG. 1A.

The control circuitry 110 cooperates with the read/write circuits 128 to perform memory operations on the memory structure 126, and includes a state machine 112, an on-chip address decoder 114, a power control module 116 and a temperature-sensing circuit 115 (see also FIG. 1B). The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for data and dummy word lines, SGS and SGD transistors and source lines. See also FIG. 4. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 15:
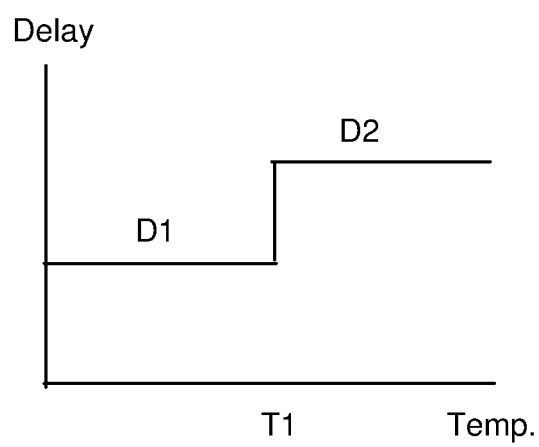
FIG. 15 depicts a plot of a delay between the ramp down of a dummy word line voltage and a ramp down of a select gate transistor voltage versus temperature.

FIG. 1B depicts an example of the temperature-sensing circuit 115 of FIG. 1A. The temperature-sensing circuit can be used to determine a temperature to set a delay as indicated in FIG. 15, for example.

The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

FIG. 2 is a block diagram depicting one embodiment of the sense block 51 of FIG. 1. An individual sense block 51 is partitioned into one or more core portions, referred to as sense modules 180 or sense amplifiers, and a common portion, referred to as a managing circuit 190. In one embodiment, there will be a separate sense module 180 for each bit line and one common managing circuit 190 for a set of multiple, e.g., four or eight, sense modules 180. Each of the sense modules in a group communicates with the associated managing circuit via data bus 172. Thus, there are one or more managing circuits which communicate with the sense modules of a set of storage elements.

Sense module 180 comprises sense circuitry 170 that performs sensing by determining whether a conduction current in a connected bit line is above or below a predetermined threshold level. Sense module 180 also includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, a flag=0 can inhibit programming, while flag=1 does not inhibit programming.

Managing circuit 190 comprises a processor 192, four example sets of data latches 194-197 and an I/O Interface 196 coupled between the set of data latches 194 and data bus 120. One set of data latches can be provide for each sense module, and data latches identified by LDL and UDL may be provided for each set. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element.

Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense module 180 may trip at one of these voltages and a corresponding output will be provided from sense module 180 to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit 190, bit line latch 182 serves double duty, both as a latch for latching the output of the sense module 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LDL and UDL latches, in a two-bit per storage element implementation. In a three-bit per storage element implementation, an additional data latch may be used. The program operation, under the control of the state machine, comprises a series of programming voltage pulses applied to the control gates of the addressed storage elements. Each program voltage is followed by a read back (verify) to determine if the storage element has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments the processor initially loads the bit line latch 182 and the sense circuitry sets it to an inhibit value during the verify process.

Each set of data latches 194-197 may be implemented as a stack of data latches for each sense module. In one embodiment, there are three data latches per sense module 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated storage element has reached certain mileposts in a program operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

FIG. 3 depicts another example block diagram of the sense block 51 of FIG. 1. The column control circuitry can include multiple sense blocks, where each sense block performs sensing, e.g., read, program verify or erase verify operations for multiple memory cells via respective bit lines. In one approach, a sense block comprises multiple sense circuits, also referred to as sense amplifiers. Each sense circuit is associated with data latches and caches. For example, the example sense circuits 350a, 351a, 352a and 353a are associated with caches 350c, 351c, 352c and 353c, respectively.

In one approach, different subsets of bit lines can be sensed using different respective sense blocks. This allows the processing load which is associated with the sense circuits to be divided up and handled by a respective processor in each sense block. For example, a sense circuit controller 360 can communicate with the set, e.g., sixteen, of sense circuits and latches. The sense circuit controller may include a pre-charge circuit 361 which provides a voltage to each sense circuit for setting a pre-charge voltage. The sense circuit controller may also include a memory 362 and a processor 363.

Figure 4:
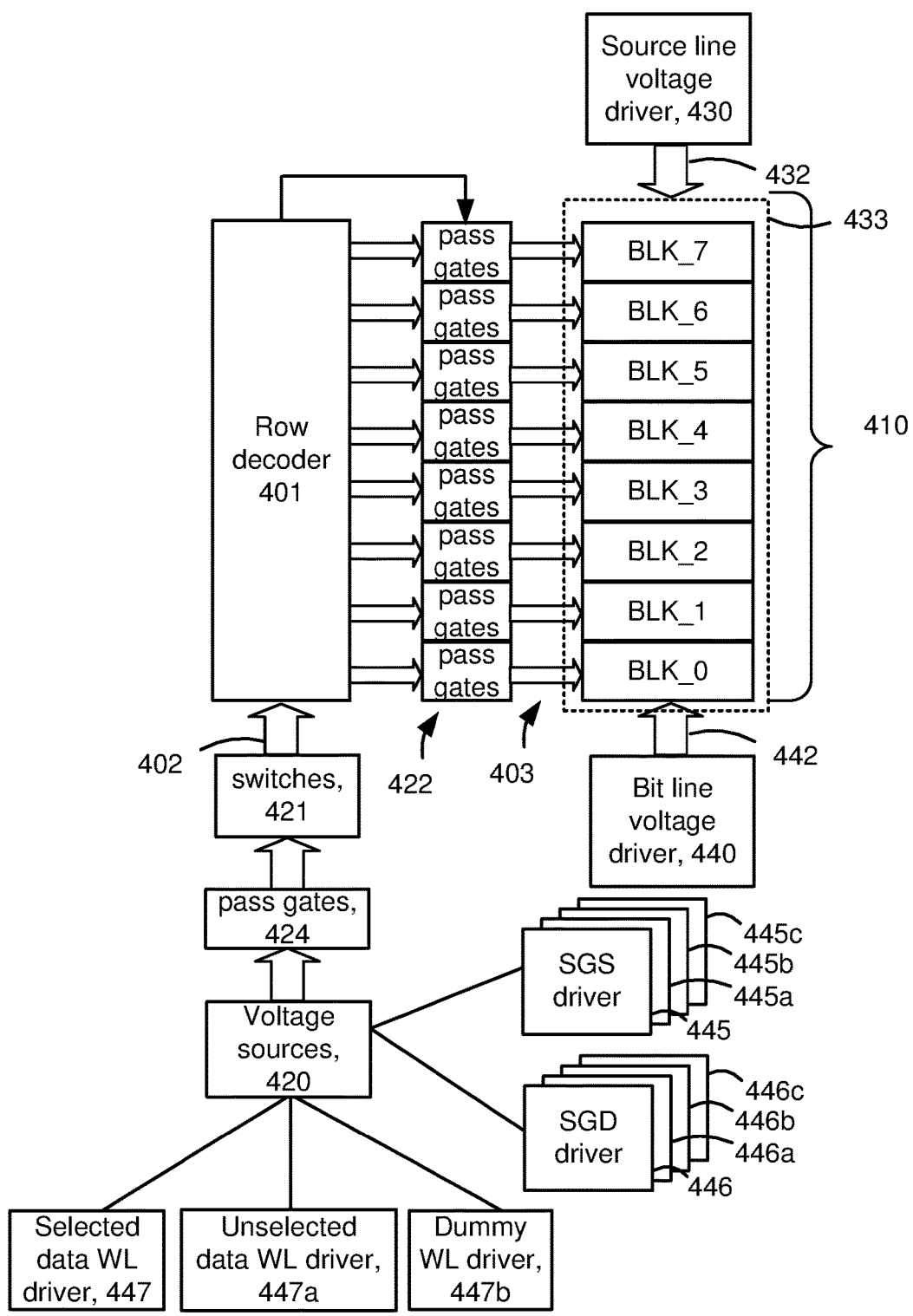
FIG. 4 depicts an example circuit for providing voltages to blocks of memory cells.

FIG. 4 depicts an example circuit for providing voltages to blocks of memory cells. In this example, a row decoder 401 provides voltages to word lines and select gates of each block in set of blocks 410. The blocks could be in a plane and includes blocks BLK_0 to BLK_7. The row decoder provides a control signal to pass gates 422 which connect the blocks to the row decoder. Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from voltage sources 420. The voltage sources may provide voltages to switches 421 which connect to the global control lines. Pass gates 424, also referred to as pass transistors or transfer transistors, are controlled to pass voltages from the voltage sources 420 to the switches 421.

The voltage sources 420 can provide voltages on word lines (WL), SGS control gates and SGD control gates, for example. The voltage sources can include a selected word line (WL) driver 447, which provides a voltage on a word line selected during a program or read operation, a driver 447a for unselected data word lines, and a dummy word line driver 447b which provides voltages on dummy word lines.

The voltage sources can also include separate SGS and SGD drivers for each sub-block. For example, SGS drivers 445, 445a, 445b and 445c, and SGD drivers 446, 446a, 446b and 446c can be provided for SB0, SB1, SB2 and SB3, respectively, such as in FIGS. 7 and 8. In another option, one SGS driver is common to the different sub-blocks in a block.

The various components, including the row decoder, may receive commands from a controller such as the state machine 112 or the controller 122 to perform the functions described herein.

A source line voltage source 430 provides the voltage Vsl to the source lines/diffusion region in the substrate via control lines 432. In one approach, the source diffusion region 433 is common to the blocks. A set of bit lines 442 is also shared by the blocks. A bit line voltage source 440 provides voltages to the bit lines.

Figure 5:
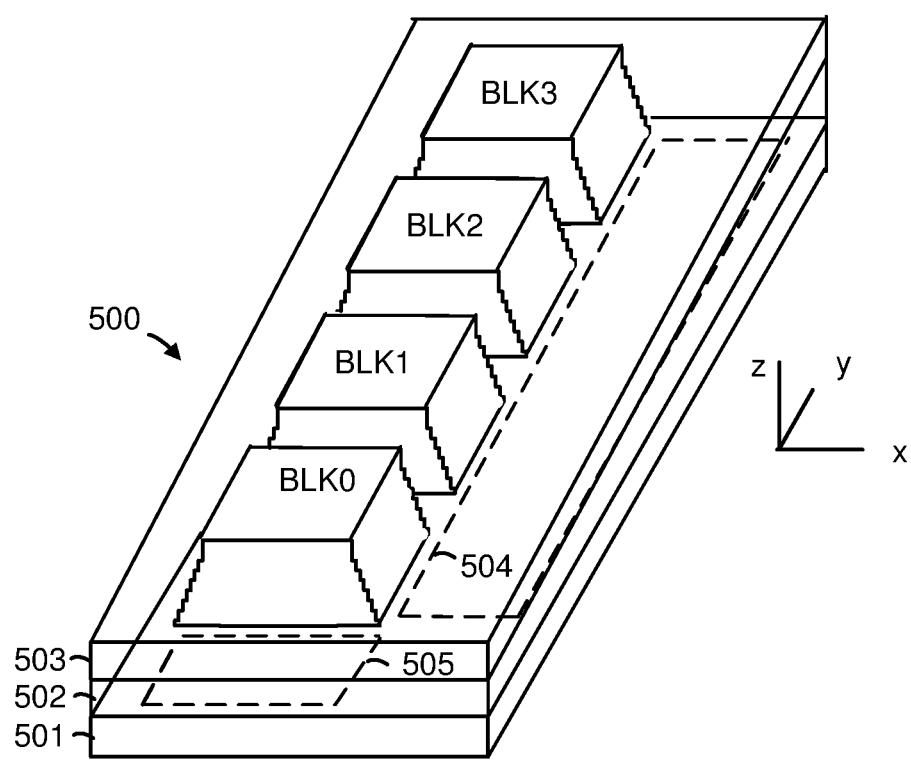
FIG. 5 is a perspective view of a memory device 500 comprising a set of blocks in an example 3D configuration of the memory structure 126 of FIG. 1.

FIG. 5 is a perspective view of a memory device 500 comprising a set of blocks in an example 3D configuration of the memory structure 126 of FIG. 1A. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The pass gates for a voltage driver of the SGS transistors may be located in this peripheral area 505, in one approach. In this case, the blocks BLK0, BLK1, BLK2 and BLK3 are at progressively further distances from the pass gates. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 6A:
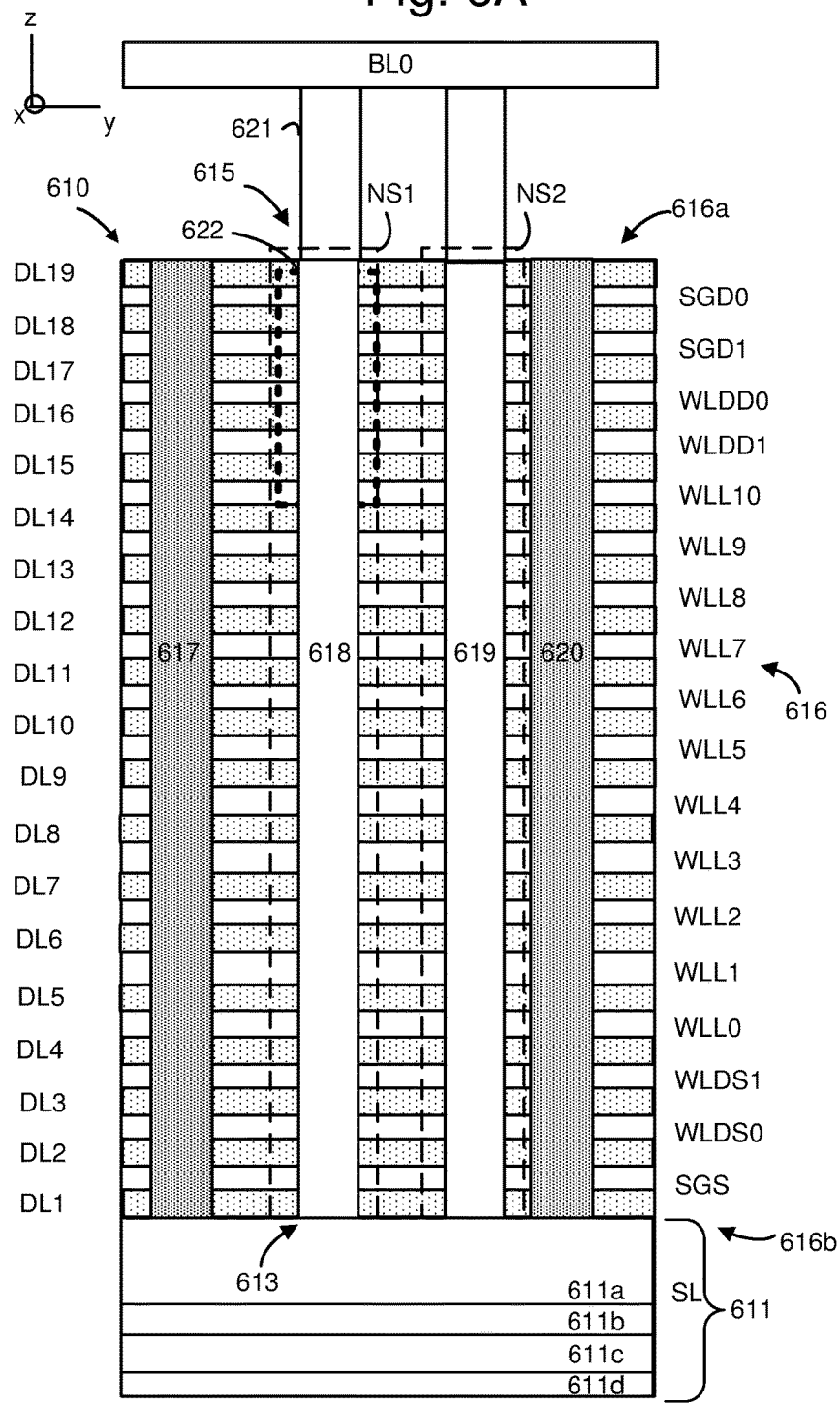
FIG. 6A depicts an example cross-sectional view of a portion of one of the blocks of FIG. 5.

FIG. 6A depicts an example cross-sectional view of a portion of one of the blocks of FIG. 5. The block comprises a stack 610 of alternating conductive and dielectric layers. In this example, the conductive layers comprise two SGD layers, one SGS layer, two source-side dummy word line layers (or word lines) WLDS1 and WLDS0, two drain-side dummy word line layers WLDD1 and WLDD0, and eleven data word line layers (or data word lines) WLL0-WLL10. WLL0 is a source-side data word line and WLDS1 is a dummy word line layer which is adjacent to the source-side data word line. WLDS0 is another dummy word line layer which is adjacent to WLDS1. WLL10 is a drain-side data word line and WLDD1 is a dummy word line layer which is adjacent to the drain-side data word line. WLDD0 is another dummy word line layer which is adjacent to WLDD1. The dielectric layers are labelled as DL1-1L19. Further, regions of the stack which comprise NAND strings NS1 and NS2 are depicted. Each NAND string encompasses a memory hole 618 or 619 which is filled with materials which form memory cells adjacent to the word lines. Region 622 of the stack is shown in greater detail in FIG. 6C.

The stack includes a substrate 611. In one approach, a portion of the source line SL comprises an n-type source diffusion layer 611a in the substrate which is in contact with a source end of each string of memory cells in a block. An erase voltage may be applied to this layer in an erase operation The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

Figure 6B:
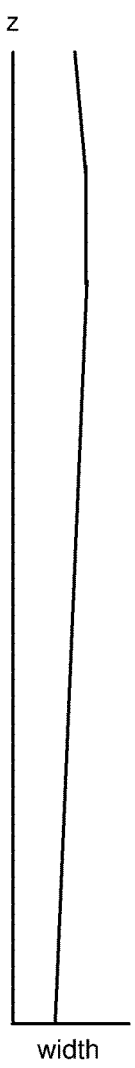
FIG. 6B depicts an example variation in the width of the memory holes of FIG. 6A along their height.

FIG. 6B depicts an example variation in the width of the memory holes of FIG. 6A along their height. Due to the etching process used to create the memory holes, and the very high aspect ratio, the cross-sectional width, e.g., diameter, of a memory hole can vary along its height. Typically, the diameter becomes progressively smaller from the top to the bottom of the memory hole. In some case, a slight narrowing occurs at the top of the hole, as depicted, so that the diameter becomes slight wider before becoming progressively smaller from the top to the bottom of the memory hole.

Due to the non-uniformity in the width of the memory hole, and the corresponding width of the vertical pillar which is formed in the memory hole, the programming and erase speed of the memory cells can vary based on their position along the memory hole, e.g., based on their height in the stack. With a smaller diameter memory hole, the electric field across the tunneling layer is stronger, so that the programming and erase speed is higher.

In this case, the memory cells are arranged along vertically-extending memory holes in the memory device, and a width of the vertically-extending memory holes varies along a height of the memory device. Further, this example shows that the memory hole is created by etching through the stack of layers which include word line layers and select gate layers. In one variation, the word line layers are etched through before the SGD layers are deposited and subsequently etched through separately. In another variation, one set of word line layers is deposited and etched through, then another set of word line layers is deposited and etched through. The memory hole diameter can differ from that shown in these different variations.

FIG. 6C depicts a close-up view of the region 622 of the stack of FIG. 6A. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a blocking oxide layer 663, a charge-trapping layer 664 or film such as silicon nitride ($Si_3N_4$) or other nitride, a tunneling layer 665, a channel 660 (e.g., comprising polysilicon), and a dielectric core 666. A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string comprises a channel which extends continuously from one or more source-end select gate transistors to one or more drain-end select gate transistors.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

The movement of holes in the charge-trapping layer 664 is discussed further in connection with FIG. 11.

FIG. 7 depicts an example view of NAND strings in sub-blocks in a 3D configuration which is consistent with FIG. 6A. A NAND string is one example of a set of connected memory cells such as series-connected memory cells. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line. For simplicity, only one NAND string per sub-block is depicted in FIG. 7. Programming of the block may occur based on a word line programming order. Moreover, one option is to program the memory cells in different portions of a word line which are in the different sub-blocks, one sub-block at a time, before programming the memory cells of the next word line. Another option programs all of the memory cells in one sub-block, one word line at a time, before programming the memory cells of the next sub-block. The word line programming order may start at WL0, the source-end word line, and end at WLL10, the drain-end word line, for example.

The NAND strings 700n, 710n, 720n and 730n have channels 660 (FIG. 6C), 710a, 720a and 730a, respectively.

Additionally, NAND string 700n includes SGS transistor 701, source-side dummy memory cells 702 and 703, data memory cells 704, 705, 706, 707, 708, 709, 710, 711, 712, 713 and 714, drain-side dummy memory cells 715 and 716, and SGD transistors 717 and 718.

The memory cell 714 is an example of an edge data memory cell at the drain end of a NAND string, and the memory cell 704 is an example of an edge data memory cell at the source end of a NAND string.

NAND string 710n includes SGS transistor 721, source-side dummy memory cells 722 and 723, data memory cells 724, 725, 726, 727, 728, 729, 730, 731, 732, 733 and 734, drain-side dummy memory cells 735 and 736, and SGD transistors 737 and 738.

NAND string 720n includes SGS transistor 741, source-side dummy memory cells 742 and 743, data memory cells 744, 745, 746, 747, 748, 749, 750, 751, 752, 753 and 754, drain-side dummy memory cells 755 and 756, and SGD transistors 757 and 758.

NAND string 730n includes SGS transistor 761, source-side dummy memory cells 762 and 763, data memory cells 764, 765, 766, 767, 768, 769, 770, 771, 772, 773 and 774, drain-side dummy memory cells 775 and 776, and SGD transistors 777 and 778.

One or more SGD transistors are provided at the drain-end of each NAND string, and one or more SGS transistors are provided at the source-end of each NAND string. The SGD transistors in SB0, SB1, SB2 and SB3 may be driven by separate control lines SGD0(0) and SGD1(0), SGD0(1) and SGD1(1), SGD0(2) and SGD1(2), and SGD0(3) and SGD1(3), respectively, in one approach. In another approach, all of the SGD transistors in a sub-block are connected and commonly driven. The SGS transistors in SB0, SB1, SB2 and SB3 may be driven by control lines SGS(0), SGS(1), SGS(2) and SGS(3), respectively.

Figure 8:
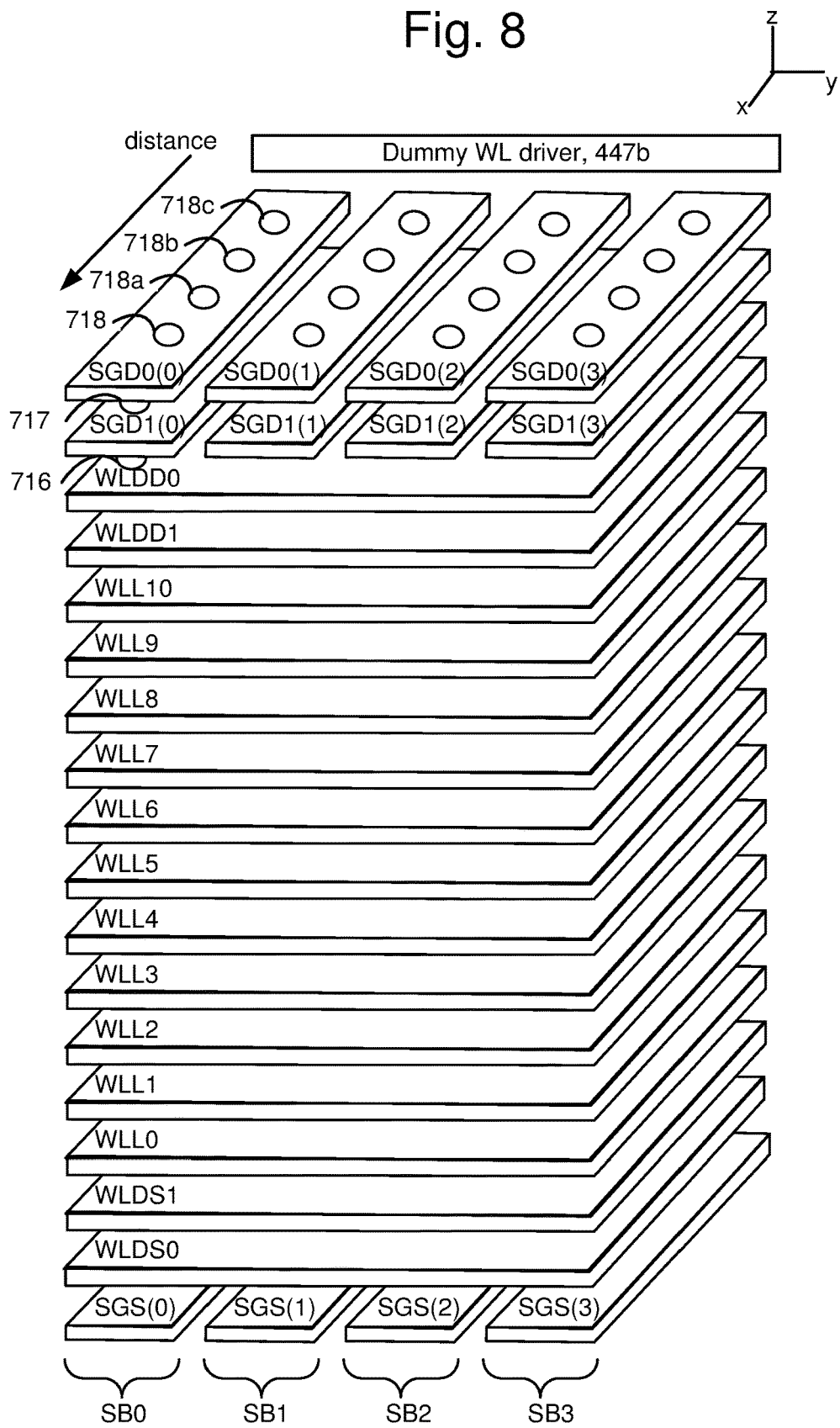
FIG. 8 depicts control gate layers in a stack consistent with FIG. 7.

FIG. 8 depicts control gate layers in a stack consistent with FIG. 7. The control gate layers include dummy word lines layers WLDS0, WLDS1, WLDD0 and WLDD1, and data word line layers WLL0-WLL10, which are shared among the different sub-blocks SB0-SB3. The control gate layers include a separate SGS control gate layer for each sub-block, e.g., SGS(0)-SGS(3) and separate SGD control gate layers for each sub-block. For example, SB0 includes SGD0(0) and SGD1(0), SB1 includes SGD0(1) and SGD1(1), SB2 includes SGD0(2) and SGD1(2), and SB3 includes SGD0(3) and SGD1(3). Additionally, four example memory holes are depicted in each sub-block. SGD transistors 718, 718a, 718b and 718c are depicted in SGD0(0), SGD transistor 717 is depicted in SGD1(0) and dummy memory cell 716 is depicted in WLDD0.

Additionally, the dummy word line driver 447b from FIG. 4 is depicted. For each sub-block, the dummy memory cells are located at different distances from the driver. With an increasing distance, a longer time is required for the voltage to be ramped down due to RC delays, as discussed further in connection with FIG. 10E.

FIG. 9 depicts a voltage signal used in a series of program loops in an example program operation. The horizontal axis denotes a program loop number, ranging from 1-22, and the vertical axis denotes voltage. During a program operation, program loops are performed for a selected word line in a selected block in each plane. A program loop comprises a program portion in which a program voltage or pulse is applied to the selected word line followed by a verify portion in which a verify signal is applied to the selected word line while one or more verify tests are performed for the associated memory cells. Other than the erased state, each assigned state has a verify voltage which is used in the verify test for the state in a program operation.

The voltage signal 900 includes a series of program voltages, including an initial program voltage 901, which are applied to a word line selected for programming. In this example, the voltage signal includes program voltages which increase stepwise in amplitude in one or more program loops of a programming pass using a fixed or varying step size. This is referred to as incremental step pulse programming, where the program voltage starts at an initial level Vpgm_int (see program voltage 901) and increases in a step in each successive program loop, for instance, until the program operation is completed. A successful completion occurs when the threshold voltages of the selected memory cells reach the verify voltages of the assigned data states.

A program operation can include a single programming pass or multiple programming passes, where each pass uses incremental step pulse programming, for instance.

The verify signal in each program loop, including example verify signal 902, can include one or more verify voltages, based on the assigned data states which are being verified for the program loop. The verify tests can encompass lower assigned data states and then midrange assigned data states and then higher assigned data states as the program operations proceeds. The example verify signals depict three verify voltages as a simplification. More detailed examples of the verify signals are provided in FIGS. 12A and 14A.

All memory cells may initially be in the erased state at the beginning of the program operation, for instance. After the program operation is completed, a Vth distribution similar to that in FIG. 10A ideally is achieved, and the data can be read from the memory cells using read voltages which are between the Vth distributions. At the same time, a read pass voltage, Vread pass (e.g., 8-10 V), also referred to as pass voltage, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. See also FIG. 10. An example encoding of bits for the A, B, C, D, E, F and G states is 111, 110, 100, 000, 010, 011, 001 and 101, respectively. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

Figure 10A:
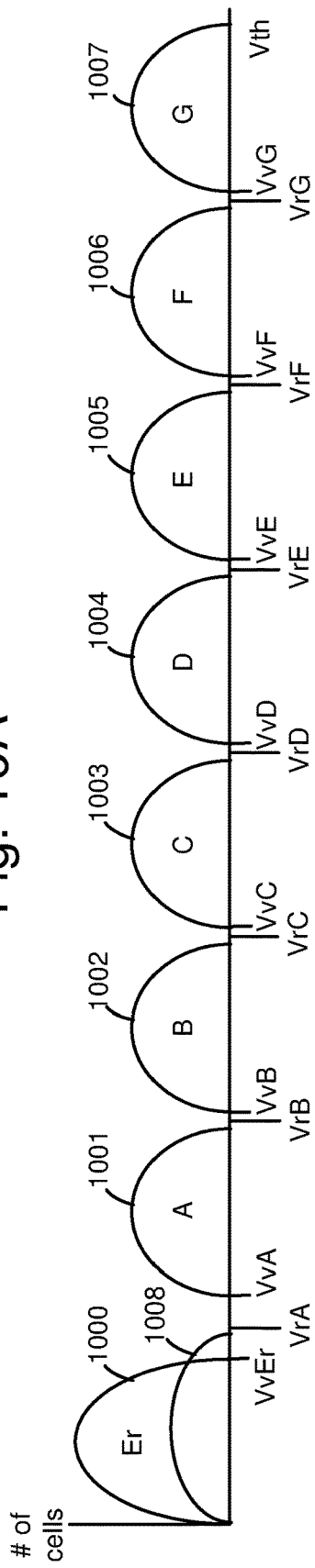
FIG. 10A depicts an example Vth distribution of sets of memory cells after a program operation.

FIG. 10A depicts an example Vth distribution of sets of memory cells after a program operation. The vertical axis depicts a number of memory cells, on a logarithmic scale, and the horizontal axis depicts a Vth of the memory cells on a linear scale. Eight data states are used, as an example. In one approach, at a start of the program operation, the memory cells are all initially in the erased state as represented by the Vth distribution 1000. After the program operation is successfully completed, the memory cells assigned to the Er state are represented by the Vth distribution 1008. The Vth distribution is upshifted due to some amount of program disturb which normally occurs.

The memory cells which are to be programmed to the A, B, C, D, E, F and G states using verify voltages of VvA, VvB, VvC, VvD, VvE, VvF and VvG, respectively, are represented by the Vth distributions 1001, 1002, 1003, 1004, 1005, 1006 and 1007, respectively. Read voltages VrA, VrB, VrC, VrD, VrE, VrF and VrG can be used for reading the states of the memory cells in a read operation. These verify voltages and read voltages are examples of control gate read levels of the selected word line voltage.

Figure 10B:
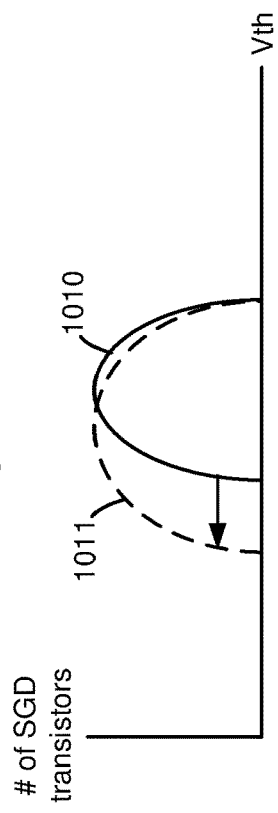
FIG. 10B depicts a Vth distribution of select gate transistors, showing how the distribution is downshifted after repeated cycles of: erase, program, read and delay.

FIG. 10B depicts a Vth distribution of select gate transistors, showing how the distribution is downshifted after repeated cycles of: erase, program, read and delay. The vertical axis depicts a number of SGD transistors on a log scale and the horizontal axis depicts Vth. The peak of the distributions may be at about Vth=1 V, for instance. Generally, the Vth distribution is shifted lower, at the lower tail, over time. Plot 1010 represents the Vth distribution of a set of SGD transistors in a fresh memory device, and plot 1011 represents the Vth distribution with a downshift which is seen after cycles of erase, program data memory cells, read and delay.

Generally, a larger Vth downshift is seen for the SGD transistors when a larger delay exists after programming and before the subsequent erase. This is because the programming causes a coupling up of the word line, as explained in connection with FIG. 12A-12D, and this coupling up creates an electric field which can move holes toward the select gate transistors as long as the electric field is present. Further, a larger Vth downshift is seen when the number of program-erase cycles is greater, as discussed in connection with FIG. 10E. If the downshift in the Vth of the SGD transistor becomes too large, it will be impossible to cutoff the channel, and severe program disturb of the data memory cells will occur. For example, this disturb could occur in the unselected sub-blocks during programming of a selected sub-block, where the SGD transistors are used to cutoff the channel to allow them to be boosted by the pass voltage.

FIG. 10C depicts a plot of a number of SGD transistors versus Vth, where an allowed ramp down time for a dummy word line voltage is relatively short after a sensing operation, when two different word lines are subject to the sensing operation in repeated erase, program and read cycles. As mentioned at the outset, the downshift of the Vth of the select gate transistors is caused by the movement of holes from the dummy memory cell to the adjacent select gate transistor in a NAND string, and this movement is a function of an electric field between the dummy memory cell to the adjacent select gate transistor. Further, the electric field is larger when the voltage at the control gate of the dummy memory cell is larger and the voltage at the control gate of the select gate transistor is smaller.

Plot 1020 represents the case of performing the cycles on the drain-side edge data word line, which is WLL10, consistent with the example of FIG. 7. Plot 1021 represents the case of performing the cycles on the word line next to the drain-side edge data word line, which is WLL9 in the example of FIG. 7. Additionally, it is assumed that when the sensing processes (e.g., read and verify) are performed on WLL10, the unselected data word lines WLL0-WLL9 and the dummy word lines WLDD0 and WLDD1, for instance, are set at a pass voltage of 8 V. This level is high enough to ensure that the memory cells of the unselected and dummy word lines are strongly conductive to allow the sensing to take place for the memory cells of WLL10. The unselected memory cells may be programmed to as high as 5 V, for example.

When the sensing processes are performed on WLL9, the unselected data word lines WLL0-WLL8 and WLL10 are set to the pass voltage of 8 V, while WLDD0 and WLDD1 are set to a lower level such as 5-6 V. This level is still high enough to ensure that the memory cells of the dummy word lines are strongly conductive since the dummy memory cells are typically programmed to a lower Vth such as 1 V. When an edge data word line is the selected word line, e.g., WLL0 or WLL10, the adjacent dummy word lines (e.g., WLDS1 and WLDS0 in the case of the source-side edge word line WLL0, and WLDD1 and WLDD0 in the case of the drain-side edge word line WLL10) can be set to a higher than nominal level to avoid a channel gradient which may occur when the word line voltages are ramped down. That is, ramping down the voltage of the selected word line voltage and the voltage of the adjacent (dummy and data) word lines at the same time and from the same level helps prevent a channel gradient which can lead to a disturb of the selected memory cells. The higher than nominal level can be the same pass voltages used on the unselected data word lines, for example.

In one option, a control circuit is configured to make the respective pass level of a dummy memory cell greater when the selected data memory cell is an edge data memory cell at the drain end of a NAND string (e.g., memory cell 704 or 714 in the NAND string 700n of FIG. 7) than when the selected data memory cell is not the edge data memory cell at the drain end of the NAND string (e.g., memory cells 705-713 in the NAND string 700n of FIG. 7).

In one option, if there are two dummy word lines at the source- and/or drain-side of the NAND strings, the higher pass voltage can be used on the adjacent dummy word line (e.g., WLDS1 in the case of WLL0 being selected, and WLDD1 in the case of WLL10 being selected). The nominal dummy word line pass voltage can be used for the remaining dummy word lines (e.g., WLDS0 in the case of WLL0 being selected, and WLDD0 in the case of the drain-side edge word line WLL10 being selected).

Due to the short ramp down time in this example, the unselected data word lines and dummy word lines may not have sufficient time to ramp down to a reduced level such as Vss (0 V) at the end of the sensing process. An additional factor is the word line coupling up which can occur after sensing, as described in connection with FIG. 12A-12D. With these factors, the voltage of the dummy word lines after the sensing process is completed will be relatively high, leading to a relatively large electric field and a greater movement of holes toward the select gate transistors. This results in a greater Vth downshift. The electric field is higher for the case of plot 1020 than for plot 1021 due to the higher dummy word line voltage during sensing.

FIG. 10C thus demonstrates that the presence of an electric field between the dummy memory cells and the select gate transistors leads to a downshift in the Vth of the select gate transistors based on the theory of hole movement as discussed herein.

FIG. 10D depicts a plot of a number of SGD transistors versus Vth, where an allowed ramp down time for a dummy word line voltage is relatively long after a sensing operation, when two different word lines are subject to the sensing operation in repeated erase, program and read cycles. Plot 1030 represents the case of performing the cycles on the drain-side edge data word line, which is WLL10 in the example of FIG. 7. Plot 1031 represents the case of performing the cycles on the data word line next to the drain-side edge data word line, which is WLL9 in the example of FIG. 7. 8 V or 5 V are applied to the dummy memory cells in the examples of plots 1030 and 1031, respectively, consistent with FIG. 10C. Compared to FIG. 10C, which is on the same Vth scale, the downshift in the Vth of the select gate transistors is significantly less. This is because the dummy word lines now have sufficient time to ramp down, e.g., decrease, to a reduced level such as Vss at the end of the sensing process. Even with the word line coupling up, the electric field between the dummy word line and the adjacent select gate word line will be less than in FIG. 10C.

Additionally, the difference between plots 1030 and 1031 is less than the difference between plots 1020 and 1021 in FIG. 10C.

FIG. 10E depicts a lower tail of a Vth distribution for SGD transistors as a function of a number of program-erase cycles and a distance of a NAND string from a dummy word line voltage driver. The distance is also depicted in FIG. 8. Due to the larger RC delay as a function of distance, the voltages of the dummy memory cells which are further from the voltage driver will take longer to ramp down than the voltages of the memory cells which are closer from the voltage driver. With the word line coupling up, the voltages of the far dummy memory cells will be coupled up from a higher starting voltage than the voltages of the close dummy memory cells, and therefore reach a higher coupled up level (see Vwl_coupled_up and Vwl_coupled_up+delta in FIGS. 12A and 12C). This in turn results in a large electric field between the dummy memory cell and the adjacent select gate transistor in each NAND string, a corresponding larger movement of holes, and a corresponding greater Vth downshift of the lower tail for the select gate transistor.

Plot 1040 represents the case of a less cycled device with 10,000 cycles of erase, program and read, and plot 1041 represents the case of a more cycled device with 50,000 cycles of erase, program and read. The plots show that the Vth downshift of the select gate transistors is greater when the distance from the driver is greater and when the number of erase, program and read cycles is greater.

FIG. 11 depicts a plot of the NAND string 700*n* of FIG. 7, showing the movement of holes toward the select gate transistors. The NAND string includes the select gate transistors, data and dummy memory cells and channel 660 discussed in connection with FIGS. 6C and 7. The notation WL is used instead of WLL in FIG. 7 for compactness. The NAND string further includes the blocking oxide layer 663, charge-trapping layer 664, tunneling layer 665 and dielectric core 666 of FIG. 6C.

During an erase operation, the voltage of the channel is increased to a positive level such as 15 V while the word line voltages are held at 0-1 V to create a positive channel-to-control gate voltage for the memory cells. The voltage of the channel may be increased by applying an erase voltage to the source end of the NAND string via the substrate, for instance. This causes holes (represented by + symbols) in the channel to be injected into the charge trapping layer, while electrons are drawn into the channel from the charge trapping layer. The arrows 1120 and 1121 represent holes being injecting into the charge trapping layer regions of WLDS0 and WLD0, respectively.

There may also be some recombining of holes and electrons in the channel. Over time, the holes can accumulate in the charge trapping layer. When a positive electric field, denoted by the arrows 1100 and 1101 is created, such as at the end of a sensing process as described herein, some of the holes in the channel region of the dummy memory cells can move toward the channel region of the select gate transistors. The main concern at the drain end of the NAND string is hole movement (arrow 1111) from WLD0 to SGD1(0) and at the source end of the NAND string, hole movement (arrow 1110) from WLDS0 to SGS(0). Essentially, a select gate transistor which is adjacent to a memory cell, whether it is a dummy or data memory cell, is most susceptible to hole movement from the memory cell and a corresponding Vth downshift. In this example, with multiple SGD transistors, the SGD transistor 718 is less susceptible to hole movement since it is not adjacent to a memory cell.

Figures 12A, 12B:
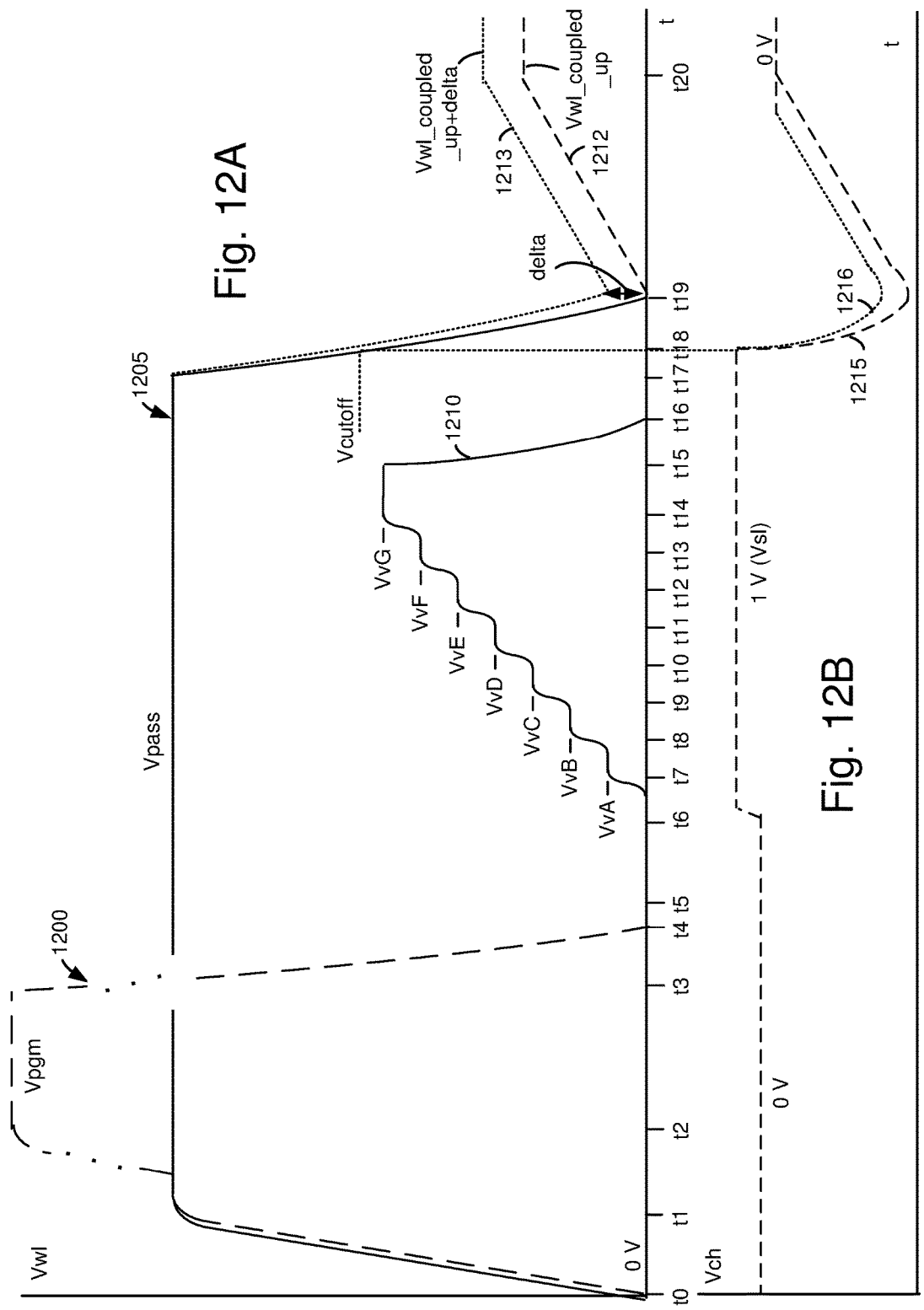
FIG. 12A depicts a plot of example waveforms in a program operation, showing coupling up of a word line voltage.
FIG. 12B depicts a plot of a channel voltage (Vch) corresponding to FIG. 12A.

FIG. 12A depicts a plot of example waveforms in a program operation, showing coupling up of a word line voltage. The coupling up can occur for data and dummy word lines after a sensing operation which occurs, e.g., as part of a program or read operation. The coupling up can be up to about 5 V, for instance. The coupling up of the dummy word line voltage results in an electric field which causes holes to move toward the select gate transistors and causes charge loss in the charge trap region near the select gate transistors. This charge loss is seen as a Vth downshift. The coupling up occurs while the word line voltages are floating. FIGS. 12A and 12B describe the coupling up which occurs after a program operation and FIGS. 12C and 12D describe the coupling up which occurs after a read operation.

The time period shown represents one program-verify iteration or loop. The horizontal axis depicts time and the vertical axis depicts word line voltage, Vwl. A program voltage 1200 is applied to a selected word line from t0-t4 and reaches a magnitude of Vpgm. The program voltage can temporarily pause at an intermediate level such as Vpass to avoid a single large transition which can have undesired coupling effects. A pass voltage 1205 is applied to the unselected word lines from t0-t19 and reaches a magnitude of Vpass, which is sufficiently high to provide the memory cells in a conductive state so that the sensing (e.g., verify) operations can occur for the memory cells of the selected word line. The pass voltage includes an increasing portion, a fixed amplitude portion, for instance, at Vpass and a decreasing portion. Optionally, the pass voltage may be increased sooner relative to the program voltage so that Vpass is reached by t0.

A verify voltage 1210 is applied to the selected word line. In this example, all seven verify voltages are applied, one after another. An eight-level memory device is used in this example. Verify voltages of VvA, VvB, VvC, VvD, VvE, VvF and VvG are applied at t8, t9, t10, t11, t12, t13 and t14, respectively. The sense circuits may be activated during each verify voltage. The waveform decreases from VvG to 0 V or other steady state level from t15-t16.

For the unselected word lines, including the dummy word lines, the decrease in Vpass will cause the memory cells to transition from a conductive state to a non-conductive state. In particular, when the Vpass falls below a cutoff level, Vcutoff (the dotted line at t18), the channel of the memory cell will become cutoff, e.g., the memory cell will become non-conductive. When a cell becomes non-conductive, it acts as a capacitor in which the control gate is one plate and the channel is another plate. A cell becomes non-conductive when Vcg<Vcutoff or Vcg<(Vth+Vsl), where Vcg is the control gate voltage of the memory cell (the word line voltage), Vth is the threshold voltage of the memory cell and Vsl is the source line voltage which in turn is approximately the voltage at the source terminal of the memory cell. For a cell in the highest programmed state, e.g., the G state, the Vth can be as low as VvG and as high as the Vth at the upper tail of the G state in the Vth distribution 1007 in FIG. 10A. Vcutoff can therefore be as low as VvG+Vsl or as high as Vth of the G state upper tail+Vsl. As the pass voltage 1205 decreases from Vcutoff to 0 V, the channel is capacitively coupled down by a similar amount, as represented by plot 1215 in FIG. 12B.

The voltage swing while the channel is cutoff will be larger when Vsl is larger. However, since Vch=Vsl, the minimum downcoupled level of Vch will be essentially independent of Vsl. For example, a 6 V swing in the word line voltage (e.g., Vcutoff=6 V) with Vsl=1 V will result in about the same minimum downcoupled level of Vch as a 5 V swing in the word line voltage (e.g., Vcutoff=5 V) with Vsl=0 V.

The plot 1212 represents one example of the coupling up of the word line voltages from t19-t20. The coupling up is depicted as occurring relatively quickly but this is not to scale. In practice, the verify operation, e.g., from t5-t19, may consume about 100 microseconds, while the coupling up of the word line may be significantly longer, in the millisecond range such as 10 milliseconds. This example assumes the word line voltage has reached its intended minimum ramped down level of Vss=0 V, for instance. When Vwl is subsequently coupled up, it reaches a maximum level of Vwl_coupled_up. Another example plot 1213 assumes that the word line voltage does not reached the intended minimum ramped down level. Instead, the word line voltage reaches Vss+delta. In this case, when Vwl is subsequently coupled up, it reaches a higher maximum level of about Vwl_coupled_up+delta. Vwl may not reach the intended minimum ramped down level when there is insufficient time for it to fully ramp down.

FIG. 12B depicts a plot of a channel voltage (Vch) corresponding to FIG. 12A. Vch for an unselected NAND string (a string not having a cell which is programmed in the current program loop), will be boosted to a level such as 8 V (not shown) during the program voltage, e.g., from t0-t4. This boosting is achieved by providing the SGD and SGS transistors of the unselected string in a non-conductive state to cause Vch to float. Vch is coupled higher due to capacitive coupling when Vpass and Vpgm are applied to the word lines. For a selected NAND string (a string having a cell which is programmed in the current program loop), Vch is typically grounded as shown during the program voltage.

During the verify voltages, Vch may be initially at about 1 V, for instance, for a selected NAND string. Vch is about the same as Vsl for the channels of the selected NAND strings. Vsl is set based on a type of sensing which is used. Examples include negative sensing in which Vsl is about 1 V and positive sensing in which Vsl is about 0 V and a negative word line voltage is used. The techniques described herein apply regardless of the level of Vsl or the type of sensing used.

The channel is capacitively coupled down to a minimum level from t18-t19 and then begins to return to a final level of, e.g., 0 V from t19-t20. If the voltages of the word lines are allowed to float starting at t19, the voltages (plot 1212) are capacitively coupled higher by the increase in Vch. In one example, the voltages of the word lines float to a peak level of Vwl_coupled_up (plot 1212), e.g., about 5 V. For example, Vcutoff may be 6 V, so that there is a 6 V change in the word line voltage, e.g., 6-0 V, which is coupled to the channel. With the initial value of Vch at 1 V and a 90% coupling ratio, the minimum Vch may be about 1-6×0.9=-4.4 V, for instance. Accordingly, as Vch returns to 0 V, there is a 4.4 V increase in Vch which is coupled to the word line, e.g., control gate, of the memory cells. By applying the 90% coupling ratio to this coupling up, Vwl_coupled_up may be about 4.4×0.9=4 V. The voltages of the word lines are floated by disconnecting the word lines from a word line driver.

In another example, the voltages of the word lines float to a peak level of about Vwl_coupled_up+delta (plot 1213). This higher level can result in a greater electric field between a dummy memory cell and an adjacent select gate transistor which leads to hole movement toward the select gate transistor and a corresponding Vth downshift. The channel voltage of plots 1215 and 1216 corresponds to the word line voltages of plots 1212 and 1213, respectively.

FIG. 12C depicts a plot of example waveforms in a read operation, showing coupling up of a word line voltage. A read operation is similar to a verify operation as both are sensing operations and both can provide a coupling up of the word line voltages. The horizontal axis depicts time and the vertical axis depicts word line voltage, Vwl. Pass voltages 1230, 1231 and 1232 are applied to the unselected word lines from t0-t3, t4-t8 and t9-t12, respectively, and have a magnitude of Vpass. The pass voltage includes an increasing portion, a portion at Vpass and a decreasing portion. A read voltage includes separate waveforms 1220 (at levels of VrA and VrE), 1221 (at levels of VrB, VrD and VrF) and 1222 (at levels of VrC and VrG) for each of the lower, middle and upper pages, respectively, consistent with FIG. 10A. The read voltages are applied to the selected word line. An eight-level memory device is used in this example.

For the unselected word lines, the decrease in Vpass will cause the memory cells to transition from a conductive state to a non-conductive state, as discussed. The dotted line at t13 indicates when a G state cell becomes non-conductive. As the pass voltage 1232 decreases from Vcutoff to 0 V, the channel is capacitively coupled down by a similar amount, as represented by the plot 1235 in FIG. 12D. As the channel voltage increases after t14, the word line voltages are floated and are coupled higher, to Vwl_coupled_up.

FIG. 12D depicts a plot of a channel voltage (Vch) corresponding to FIG. 12C. The channel is capacitively coupled down to a minimum level of Vch_min from t13-t14 and then begins to return to a final level of, e.g., 0 V from t14-t15. If the voltages of the word lines are allowed to float starting at t14, the voltages (plot 1232) are capacitively coupled higher by the increase in Vch (plot 1235). The voltages of the word lines float to a peak level of Vwl_coupled_up, as discussed in connection with FIG. 12B.

The case of coupling up to Vwl_coupled_up+delta can also occur, as discussed in connection with FIGS. 12A and 12B.

FIG. 13A depicts a flowchart of an example sensing process. Step 1300 begins a sensing operation for selected memory cells in selected NAND strings. These are memory cells which are connected to a selected word line among a plurality of word lines and in a selected region or sub-block. For a read operation, typically a set of adjacent memory cells of the selected word line are sensed concurrently. For a verify operation, memory cells of the selected word line are sensed if they have a program status as indicated by latches of the associated NAND strings. Step 1301 involves applying a voltage at a demarcation level to the selected memory cells via the selected word line. For example, for a read operation in which there are eight data states, the voltage may be one or more of VrA-VrG in FIG. 10A. For a verify operation in which there are eight data states, the voltage may be one or more of VvA-VvG in FIG. 10A.

Step 1302 involves applying a voltage at a respective pass level to the unselected data memory cells via the unselected data word lines, and at a respective pass level to the dummy memory cells via the dummy word lines. The pass voltages are high enough to provide the unselected data memory cells and the dummy memory cells in a conductive state so they do not interfere with the sensing of the selected memory cells. As discussed, the pass voltage for a dummy word line can be higher when the selected word line is an edge word line. Step 1303 involves applying a voltage at a respective pass level to the SGD and SGS select gate transistors for the selected NAND strings. This allows a current to flow in the selected NAND strings which can be detected by sensing circuitry. The respective pass levels for the data word lines, the dummy word lines and the select gate transistors can be the same or different. See FIG. 14A-14L for further details. Step 1304 involves applying a voltage at a respective pass level to the SGD and SGS select gate transistors for the unselected NAND strings.

Step 1305 involves using sensing circuitry to sense a conductive state of the selected memory cells, such as by evaluating the currents in the associated NAND strings. Note that steps 1301-1305 may occur at the same time. A decision step 1306 determines whether there is a next demarcation voltage to apply. If this decision step is true, a next demarcation voltage is applied at step 1301. If this decision step is false, step 1307 involves ramping down the voltages of the word lines and select gate transistors from the respective pass levels to respective reduced levels, such as Vss or Vdd. This can include ramping down the voltage of a dummy word line before ramping down voltages of data word lines. Additional details are provided further below. Step 1308 represents the end of the sensing operation. For a read operation (see FIG. 13B), the controller may subsequently perform some other task such as a read operation for another sub-block or word line, or a program or erase operation, or enter an idle state, for instance. For a program operation, the controller may subsequently perform a next program-verify iteration or end the program operation.

Step 1307 can be implemented using one or more of steps 1307a-1307c. See also FIG. 14A-14L for further details. For example, step 1307a involves ramping down the voltage of a dummy word line before ramping down voltages of select gate transistors. See FIGS. 14G and 14I-14L. Step 1307b involves ramping down the voltages of data word lines before ramping down voltages of select gate transistors. See FIGS. 14B, 14F, 14G, 14K and 14L. Step 1307c involves providing voltages of the select gate transistors at an elevated level (Vsg_el), above the respective pass level (Vsg_pass), during the decrease of the voltage of the dummy memory cells, and before a decrease of the voltage of the select gate transistor from the elevated level to the respective reduced level. See FIGS. 14G, 14J and 14L.

Figure 13B:
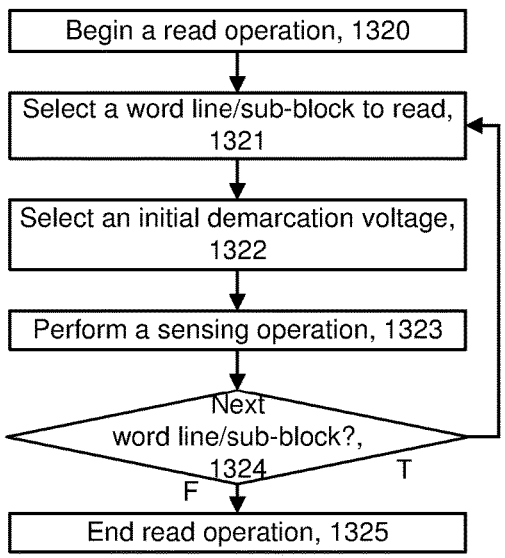
FIG. 13B depicts a flowchart of an example read operation which can use the sensing process of FIG. 13A.

FIG. 13B depicts a flowchart of an example read operation which can use the sensing process of FIG. 13A. A read operation begins at step 1320, e.g., in response to a read command from a controller. Step 1321 selects a word line and sub-block to read. Step 1322 selects an initial demarcation voltage, e.g., a read voltage. Step 1323 involves performing a sensing operation using one or more read voltages, e.g., as discussed in connection with FIG. 13A. A decision step 1324 determines whether there is a next word line or sub-block to read. If decision step 1324 is false, step 1325 represents the end of the read operation. If decision step 1324 is true, a next word line or sub-block to read is selected at step 1321.

Figure 13C:
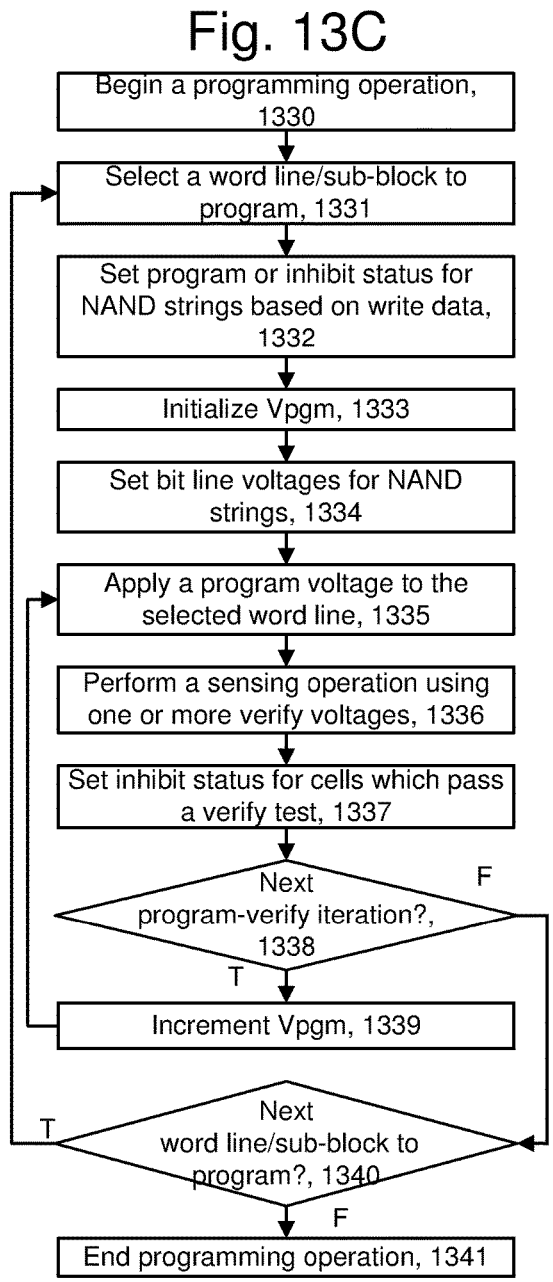
FIG. 13C depicts a flowchart of an example program operation which can use the sensing process of FIG. 13A.

FIG. 13C depicts a flowchart of an example program operation which can use the sensing process of FIG. 13A. At step 1330, a program operation begins. Step 1331 selects a word line and sub-block to program. Step 1332 sets a program or inhibit status for the NAND strings based on the write data. Step 1333 initializes a program voltage, Vpgm. For example, sub-block SB0 may be selected for programming, after which SB1, SB2 and SB3 are selected in turn for programming in the selected word line layer. Step 1334 sets bit line voltages for the NAND strings. For example, the bit line voltage may be 0 V for a NAND string with a program status and 2-3 V for a NAND string with an inhibit status. Each memory cell in the region can be connected to a respective bit line via a drain-end of a NAND string in which the memory cell is located. Step 1335 applies a program voltage to the selected word line. See FIG. 9.

Step 1336 performs a sensing operation using one or more verify voltages, e.g., as discussed in connection with FIG. 13A. Step 1337 sets an inhibit status for cells which pass a verify test. A decision step 1338 determines whether there is a next program-verify iteration for the word line and sub-block. This is false if all or nearly all of the memory cells in the sub-block have been programmed. If decision step 1338 is true, step 1339 increments Vpgm and step 1335 begins the next program-verify iteration by applying another program voltage. If decision step 1338 is false, a decision step 1340 determines whether there is a next word line or sub-block of memory cells to program. If decision step 1340 is true, step 1331 selects another word line and sub-block of memory cells to program. If decision step 1340 is false, the program operation for the word line/sub-block ends at step 1341.

In FIG. 14A-14L, the horizontal direction indicates a common time line with time points W412 and the vertical direction denotes a voltage.

FIG. 14A depicts an example voltage signal for a selected word line (WL_sel) in a sensing process. This example uses voltages at two demarcation levels, Vcgr1 and Vcgr2. One or more demarcation levels may be used. The voltage signal is at Vss or 0 V from t0-t2, Vcgr1 from t2-t4, and Vcgr2 from t4-t6. These voltages can be read or verify voltages, such as depicted in FIG. 10A, for example. In one option (plot 1400a), the voltage is increased to a pass level (Vpass) from t6-t10 before being decreased or ramped down from Vpass to Vss or Vdd at t10. Vdd may be a power supply voltage such as 2 V. The voltage remains at Vss or Vdd until t12. Vss and Vdd are examples of respective reduced levels.

This option to increase the voltage to Vpass can avoid channel gradients which can cause disturbs, by ramping down the selected word line and an adjacent unselected word line from the same level. If two adjacent word lines are ramped down from different levels, the channel gradient can occur. In another option, the voltage remains at Vcgr2 (plot 1400h) and is ramped down from Vcgr2 to Vss or Vdd at t10.

Plots 1400c and 1400e depict the ramp down from Vpass to Vdd. Plots 1400g and 1400f depict the ramp down from Vpass to Vss. Plots 1400d and 1400e depict the ramp down from Vcgr2 to Vdd. Plots 1400b and 1400f depict the ramp down from Vcgr2 to Vss.

FIG. 14B depicts an example voltage signal for unselected word lines (WL_unsel) in a sensing process. The voltage increases from Vss to Vpass at t1, remains at Vpass until t10 and is ramped down from Vpass to Vss or Vdd at t10. This voltage provides the unselected memory cells in a conductive state to allow sensing of the selected memory cells in each NAND string. Plots 1401b and 1401c depict the ramp down from Vpass to Vdd. Plots 1401a and 1401d depict the ramp down from Vpass to Vss. In one example, the respective reduced level of the dummy memory cell is a negative voltage (see Vneg, plot 1402b in FIG. 14G), and the respective reduced level of the unselected data memory cells is a non-negative voltage, e.g., Vdd (plot 1401c) or Vss (plot 1401d). In another example, the respective reduced level of the dummy memory cell is 0 V (plot 1402a in FIG. 14G), and the respective reduced level of the unselected data memory cells is a positive voltage (plot 1401c in FIG. 14B).

When Vwl_dummy is Vss or Vneg, the respective reduced level of the dummy memory cell is lower than the respective reduced level of the unselected data memory cells (e.g., Vdd, plot 1401c). This provides a benefit by providing an electric field in a direction from the select gate transistor to the dummy memory cell which discourages movement of holes from the dummy memory cell to the select gate transistor.

FIG. 14C depicts an example voltage signal for unselected select gate transistors (SGD/SGS_unsel) in a sensing process. These are select gate transistors in unselected NAND strings, e.g., NAND strings which are not being read or subject to a verify test. In one option (plot 1403a), the voltage is increased from Vss to Vsg_pass, e.g., 6 V, at t6, then ramped down to Vss at t9. The increase to Vsg_pass helps to discharge the channels of the unselected strings. In another option (plot 1403b), the voltage remains at Vss.

FIG. 14D depicts an example voltage signal for a bit line (BL) of a selected NAND string in a sensing process. The selected NAND string includes a selected memory cell which is selected for sensing. The voltage for an unselected bit line, e.g., which is connected to an unselected NAND string, may remain at 0 V (not shown). A steady state voltage, e.g., Vss=0 V, is applied initially, and a sensing voltage, Vbl_sense, e.g., 2-3 V, is applied from t1-t6. During sensing for each demarcation (read or verify) voltage, Vbl may remain relatively steady or may decay during sensing of a selected NAND string. The case with a bit line decay is depicted by plots 1410a and 1410b. If Vbl decays below a specified trip level, Vbl_trip, the selected memory string is considered to be in a conductive state and the Vth of the selected memory cell is below the demarcation voltage. The determination of whether Vbl decays below Vbl_trip is made at t3 and t5 for sensing relative to Vcgr1 and Vcgr2, respectively. If Vbl does not decay below Vbl_trip, the selected memory string is considered to be in a non-conductive state and the Vth of the selected memory cell is equal to or above the demarcation voltage. The bit line voltage is floated from t6-t9 and then ramped down to Vss at t9.

FIG. 14E depicts an example voltage signal for a source line (SL) in a sensing process. Vss is applied initially, and a sense voltage, Vsl, e.g., 2-3 V, is applied from t1-t6. The source line voltage is floated from t6-t9 and then ramped down to Vss at t9.

FIG. 14F-14L provide three general proposals for an early ramp down of the dummy word line voltage. In a first proposal, the dummy word lines ramps down, e.g., starts to ramp down, before the data word lines. This helps to ensure that the dummy word line voltages have completely ramped down before the select gate transistor voltages ramp down. This extra times allows the dummy memory cell voltages to ramp down even when they have a higher RC time constant due to their location relative to the voltage source. Additionally, the dummy word line voltage can be ramped down to a lower respective reduced level than the data word lines. This helps reduce the maximum level of the coupled up dummy word line voltage (Vwl_coupled_up in FIGS. 12A and 12C) and the resulting electric field. This proposal does not impose a time penalty. For example, see FIGS. 14F and 14G.

A second proposal is based on the first proposal but the voltages of both the data word lines and the select gate transistors ramp down together after the ramp down of the voltage of the dummy word lines. The early ramp down of the dummy word line voltages may help reduce a Fowler-Nordheim type of read disturb which is causes by a channel gradient. For example, see FIGS. 14F, 14G, 14I and 14J.

A third proposal is based on the second proposal but the ramp down sequence involves the dummy word line voltages, then the data word line voltages, and then the select gate transistor voltages. This proposal helps to minimize the coupled up dummy word line voltage. For example, see FIGS. 14F, 14G, 14K and 14L.

FIG. 14F repeats the example voltage signal 1400a of FIG. 14A for a selected word line (WL_sel) in a sensing process, for reference in connection with FIG. 14G to 14L. The voltage of WL_sel includes a ramp down at t10.

FIG. 14G depicts an example voltage signal for a dummy word line (WL_dummy) in a sensing process, where a ramp down of the voltage signal from a respective pass voltage at t9 occurs at the same time as (concurrently with) the ramp down of SGD/SGS_sel, as depicted in FIG. 14H. The voltage signal ramps up from Vss to Vpass at t0, remains at Vpass until t9, then ramps down to Vss (plot 1402a) or a negative voltage, Vneg (plot 1402b).

If the voltage of WL_dummy was to ramp down at t10 while the voltage of SGD/SGS_sel ramps down at t9, there would be an electric field from t9-t10 which encourages the movement of holes from the dummy word line to the select gate transistor. This electric field is based on Vwl_dummy–Vsgd/sgs_sel or Vpass–Vss=Vpass. For example, refer to the electric fields denoted by the arrows 1100 and 1101 in FIG. 11. By providing the ramp down concurrently at t9 for WL_dummy and SGD/SGS_sel, Vwl_dummy–Vsgd/sgs_sel=0, so this avoids creating an electric field from a dummy memory cell to an adjacent select gate transistor which would encourage the movement of holes from the dummy memory cell to the select gate transistor.

Moreover, ramping down WL_dummy to Vss instead of Vdd also reduces an electric field from a dummy memory cell to an adjacent select gate transistor. For example, the electric field based on Vwl_dummy(Vss)–Vsgd/sgs_sel (Vss)=0 is less than the electric field based on Vwl_dummy (Vdd)–Vsgd/sgs_sel(Vss). In contrast, WL_sel and WL_unsel might ramp down from Vpass to Vdd to minimize channel gradients near WL_sel which can cause a disturb. The timing and/or ramp down level of the voltage signal of WL_dummy can therefore be different than the voltage signals of the data word lines, e.g., WL_sel and WL_unsel, to reduce a Vth downshift of a select gate transistor.

In the option of plot 1402b, ramping down Vwl_dummy to a negative voltage provides an electric field from the select gate transistor to the dummy memory cell which further discourages movement of holes from the dummy memory cell to the adjacent select gate transistor. This electric field is based on Vsgd/sgs_sel(Vss)–Vwl_dummy (Vneg).

FIG. 14H depicts an example voltage signal for a select gate transistor of a selected NAND string (SGD/SGS_sel), where a ramp down of the voltage signal from a respective pass voltage occurs at t9. As discussed, in one option, this ramp down is concurrent with the ramp down of WL_dummy at plot 1402b of FIG. 14G. The voltage signal increases from Vss to Vsg_pass at t1, remains at Vsg_pass until t9, then ramps down to Vss at t9.

FIG. 14I depicts an example voltage signal for a select gate transistor of a selected NAND string (SGD/SGS_sel), where a ramp down of the voltage signal from a respective pass voltage occurs at t10. This voltage signal can be used with plot 1402a or 1402b of FIG. 14G, for instance. The voltage signal increases from Vss to Vsg_pass at t1, remains at Vsg_pass until t10, then ramps down to Vss at t10. In this case, when the voltage of WL_dummy ramps down at t9, SGD/SGS_sel remains at Vsg_pass until t10. In the time period of t9-t10, an electric field is created from a select gate transistor to an adjacent dummy word line, opposite to the electric fields denoted by the arrows 1100 and 1101 in FIG. 11. The electric field is based on Vsgd/sgs_sel(Vsg_pass)–Vwl_dummy(Vss). This helps prevent the movement of holes from the dummy memory cell to the adjacent select gate transistor.

In this example, a control circuit, to sense a selected data memory cell, is configured to apply a voltage to the select gate transistor at a respective pass level (Vsg_pass), and to decrease the voltage of the select gate transistor to a respective reduced level (Vss), below the respective pass level, at t10, after the decrease of the voltage of the dummy memory cell at t9.

FIG. 14J depicts an example voltage signal for a select gate transistor of a selected NAND string (SGD/SGS_sel), where the voltage signal is increased from a respective pass voltage to an elevated level at t8, then ramped down from the elevated level at t10. The voltage signal increases from Vss to Vsg_pass at t1, remains at Vsg_pass until t8, increases from Vsg_pass to Vsg_el at t9, then ramps down from Vsg_el to Vss at t10. Vsg_el is an elevated level, e.g., 7-8 V, which is greater than Vsg_pass, e.g., 5-6 V. In the time period of t9-t10, an electric field is created from a select gate transistor to an adjacent dummy word line, opposite to the electric fields denoted by the arrows 1100 and 1101 in FIG. 11. The electric field is based on Vsgd/sgs_sel(Vsg_el)–Vwl_dummy(Vss). This helps prevent the movement of holes from the dummy memory cell to the adjacent select gate transistor. Moreover, the electric field is greater than in FIG. 14I since SGD/SGS_sel is at Vsg_el instead of Vsg_pass when WL_dummy is ramping down and at its reduced level. The electric field to prevent the movement of holes is therefore greater than in FIG. 14I.

In this example, a control circuit is configured to provide the voltage of the select gate transistor at an elevated level (Vsg_el), above the respective pass level (Vsg_pass), during the decrease of the voltage of the dummy memory cells (t9-t10), and before a decrease of the voltage of the select gate transistor from the elevated level to the respective reduced level (at t10).

FIG. 14K depicts an example voltage signal for a select gate transistor of a selected NAND string (SGD/SGS_sel), where a ramp down of the voltage signal from a respective pass voltage occurs at t11. The voltage signal increases from Vss to Vsg_pass at t1, remains at Vsg_pass until t11, then ramps down from Vsg_pass to Vss at t11. The voltage of the select gate transistors ramps down after the ramp down of the voltages of the data word lines, WL_sel and WL_unsel, and WL_dummy. Delaying the ramp down of the voltage signal has similar benefits as discussed in connection with FIG. 14I. A further benefit from delaying the ramp down is that it allows more time to ensure that Vwl_dummy reaches its minimum ramped down level of Vss, for instance, in FIG. 14G. As a result, the coupled up voltage for the dummy word line will be minimized. This in turn minimizes the electric field from a dummy word line to an adjacent select gate transistor. In contrast, if Vwl_dummy reached a minimum ramped down level of Vss+delta, the coupled up voltage would be about Vwl_coupled_up+delta instead of Vwl_coupled_up. Refer also to the discussion in connection with FIGS. 12A and 12B.

FIG. 14L depicts an example voltage signal for a select gate transistor of a selected NAND string (SGD/SGS_sel), where the voltage signal is increased from a respective pass voltage to an elevated level at t8, then ramped down from the elevated level at t11. The voltage signal increases from Vss to Vsg_pass at t1, remains at Vsg_pass until t8, increases from Vsg_pass to Vsg_el at t9, then ramps down from Vsg_el to Vss at t11. In the time period of t9-t11, an electric field is created from a select gate transistor to an adjacent dummy word line, as discussed in connection with FIG. 14J. This helps prevent the movement of holes from the dummy memory cell to the adjacent select gate transistor. Moreover, the electric field exists for a longer period of time than in FIG. 14J so the benefit is greater.

FIG. 15 depicts a plot of a delay between the ramp down of a dummy word line voltage and a ramp down of a select gate transistor voltage versus temperature. A delay between the decrease of the voltage of a dummy memory cell, e.g., at t9 in FIG. 14G, and the subsequent decrease of the voltage of the unselected data memory cells, e.g., at t10 in FIG. 14B, can be greater when the temperature is greater. Generally, a higher temperature is associated with a large RC time constant which is needed for a voltage to ramp down, as well as increased mobility of the holes in the charge trapping layers. Accordingly, one approach to minimize the delay while still allowing sufficient time for a voltage ramp down is to set the delay as an increasing function of temperature. This can be implemented, e.g., by setting the time to start the decrease of the voltage of a dummy memory cell earlier when the temperature is higher. It is also possible to set a delay between the decrease of the voltage of a dummy memory cell, e.g., at t9 in FIG. 14G, and the subsequent decrease of the voltage of the select gate transistor, e.g., at t10 in FIG. 14I or t11 in FIG. 14K, to be an increasing function of temperature.

In one approach, which provides for a simplified implementation, the delay is set at one of two levels. A delay of D1 is set if the temperature is less than a demarcation temperature of T1, and a delay of D2>D1 is set if the temperature is equal to or greater than T1. Other approaches are possible as well. Assuming the start of the ramp down time of the dummy word line is at t9, the start of the ramp down of the select gate transistor, or the start of the ramp down time of the decrease of the voltage of the unselected data memory cells, is t9+D1 or t9+D2, for example.

In one implementation, an apparatus comprises: a NAND string comprising a select gate transistor and a plurality of memory cells, including a dummy memory cell adjacent to the select gate transistor, and data memory cells; and a control circuit, the control circuit, to sense a selected data memory cell of the NAND string, is configured to apply a voltage to the selected data memory cell at a demarcation level, a voltage to unselected data memory cells of the NAND string at a respective pass level, and a voltage to the dummy memory cell at a respective pass level, and to subsequently to decrease the voltage of the dummy memory cell from the respective pass level to a respective reduced level before a decrease of the voltage of the unselected data memory cells from the respective pass level to a respective reduced level.

In another implementation, a method comprises: sensing a selected data memory cell of a NAND string, the NAND string comprising a select gate transistor and a plurality of memory cells, including a dummy memory cell adjacent to the select gate transistor, and data memory cells, the sensing comprises applying a voltage to the selected data memory cell at a demarcation level, a voltage to unselected data memory cells of the NAND string at a respective pass level, and a voltage to the dummy memory cell at a respective pass level; and after the sensing, decreasing the voltage of the dummy memory cell from the respective pass level to a respective reduced level before decreasing the voltage of the unselected data memory cells from the respective pass level to a respective reduced level.

In another implementation, an apparatus comprises: means for applying a voltage to unselected data memory cells of a set of connected memory cells at a respective pass level; means for applying a voltage to a dummy memory cell of the set of connected memory cells; and means for decreasing the voltage of the dummy memory cell from the respective pass level to a respective reduced level before decreasing the voltage of the unselected data memory cells from the respective pass level to a respective reduced level.

The means for applying a voltage to unselected data memory cells may include the power control module 116, control circuitry 110 and controller 122 of FIG. 1A, the unselected data WL driver 447a of FIG. 4, or other logic hardware, and/or other executable code stored on a computer readable storage medium or device. Other embodiments may include similar or equivalent means.

The means for applying a voltage to a dummy memory cell, and the means for decreasing the voltage of the dummy memory cell, may include the power control module 116, control circuitry 110 and controller 122 of FIG. 1A, the dummy WL driver 447b of FIG. 4, or other logic hardware, and/or other executable code stored on a computer readable storage medium or device. Other embodiments may include similar or equivalent means.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
    a NAND string comprising a select gate transistor and a plurality of memory cells, including a dummy memory cell adjacent to the select gate transistor, and data memory cells; and
    a control circuit, the control circuit, to sense a selected data memory cell of the NAND string, is configured to apply a voltage to the selected data memory cell at a demarcation level, a voltage to unselected data memory cells of the NAND string at a respective pass level, and a voltage to the dummy memory cell at a respective pass level, and to subsequently to decrease the voltage of the dummy memory cell from the respective pass level to a respective reduced level before a decrease of the voltage of the unselected data memory cells from the respective pass level to a respective reduced level.

2. The apparatus of claim 1, wherein:
    the respective reduced level of the dummy memory cell is lower than the respective reduced level of the unselected data memory cells.

3. The apparatus of claim 2, wherein:
    the respective reduced level of the dummy memory cell is a negative voltage; and
    the respective reduced level of the unselected data memory cells is a non-negative voltage.

4. The apparatus of claim 2, wherein:
    the respective reduced level of the dummy memory cell is 0 V; and
    the respective reduced level of the unselected data memory cells is a positive voltage.

5. The apparatus of claim 1, further comprising:
    a circuit configured to sense a temperature, wherein a delay between the decrease the voltage of the dummy memory cell and the decrease of the voltage of the unselected data memory cells is greater when the temperature is greater.

6. The apparatus of claim 1, wherein:
    the control circuit, to sense the selected data memory cell, is configured to apply a voltage to the select gate transistor at a respective pass level, and to decrease the voltage of the select gate transistor to a respective reduced level, below the respective pass level, before the decrease of the voltage of the unselected data memory cells.

7. The apparatus of claim 6, wherein:
    the decrease the voltage of the select gate transistor is concurrent with the decrease of the voltage of the dummy memory cell.

8. The apparatus of claim 1, wherein:
    the control circuit, to sense the selected data memory cell, is configured to apply a voltage to the select gate transistor at a respective pass level, and to decrease the voltage of the select gate transistor to a respective reduced level, below the respective pass level, after the decrease of the voltage of the dummy memory cell.

9. The apparatus of claim 8, wherein:
    the control circuit is configured to provide the voltage of the select gate transistor at an elevated level, above the respective pass level, during the decrease of the voltage of the dummy memory cell, and before a decrease of the voltage of the select gate transistor from the elevated level to the respective reduced level.

10. The apparatus of claim 8, wherein:
    the decrease the voltage of the select gate transistor is concurrent with the decrease of the voltage of the unselected data memory cells.

11. The apparatus of claim 8, wherein:
    the decrease the voltage of the select gate transistor is after the decrease of the voltage of the unselected data memory cells.

12. The apparatus of claim 1, wherein:
    the sensing comprises a read operation or a verify operation.

13. The apparatus of claim 1, wherein:
    the NAND string has a drain end and a source end;
    the dummy memory cell and the select gate transistor are at the drain end; and
    the control circuit is configured to make the respective pass level of the dummy memory cell greater when the selected data memory cell is an edge data memory cell at the drain end of the NAND string than when the selected data memory cell is not the edge data memory cell at the drain end of the NAND string.

14. A method, comprising:
sensing a selected data memory cell of a NAND string, the NAND string comprising a select gate transistor and a plurality of memory cells, including a dummy memory cell adjacent to the select gate transistor, and data memory cells, the sensing comprises applying a voltage to the selected data memory cell at a demarcation level, a voltage to unselected data memory cells of the NAND string at a respective pass level, and a voltage to the dummy memory cell at a respective pass level; and
after the sensing, decreasing the voltage of the dummy memory cell from the respective pass level to a respective reduced level before decreasing the voltage of the unselected data memory cells from the respective pass level to a respective reduced level.

15. The method of claim 14, wherein:
the respective reduced level of the dummy memory cell is lower than the respective reduced level of the unselected data memory cells.

16. The method of claim 14, further comprising:
during the sensing, applying a voltage to the select gate transistor at a respective pass level; and
after the sensing, decreasing the voltage of the select gate transistor to a respective reduced level, below the respective pass level, after the decreasing of the voltage of the dummy memory cell.

17. The method of claim 16, further comprising:
providing the voltage of the select gate transistor at an elevated level, above the respective pass level, during the decreasing of the voltage of the dummy memory, and before decreasing of the voltage of the select gate transistor from the elevated level to the respective reduced level.

18. An apparatus, comprising:
means for applying a voltage to unselected data memory cells of a set of connected memory cells at a respective pass level;
means for applying a voltage to a dummy memory cell of the set of connected memory cells; and
means for decreasing the voltage of the dummy memory cell from the respective pass level to a respective reduced level before decreasing the voltage of the unselected data memory cells from the respective pass level to a respective reduced level.

19. The apparatus of claim 18, wherein:
the respective reduced level of the dummy memory cell is lower than the respective reduced level of the unselected data memory cells.

20. The apparatus of claim 18, further comprising:
a select gate transistor connected to the set of connected memory cells; and
means for applying a voltage to the select gate transistor at a respective pass level; and
means for decreasing the voltage of the select gate transistor to a respective reduced level, below the respective pass level, after the decreasing of the voltage of the dummy memory cell.

* * * * *